US009026409B2

(12) United States Patent
Schmidtke et al.

(10) Patent No.: US 9,026,409 B2
(45) Date of Patent: May 5, 2015

(54) SYSTEMS, METHODS, AND SOFTWARE FOR AUTOMATED DESIGN AND MANUFACTURING OF HVAC CONTROL PANELS

(75) Inventors: Troy Schmidtke, St. Paul, MN (US); Mitchell T. DeJong, St. Paul, MN (US); Dipesh Karki, Shakopee, MN (US); Peder A. Lindberg, Saint Louis Park, MN (US); Christopher Ray Kerkhoff, White Bear Lake, MN (US)

(73) Assignee: Design Ready Controls, Inc., Rockford, MN (US)

( * ) Notice: Subject to any disclaimer, the term of this patent is extended or adjusted under 35 U.S.C. 154(b) by 154 days.

(21) Appl. No.: 13/207,009

(22) Filed: Aug. 10, 2011

(65) Prior Publication Data

US 2011/0307100 A1    Dec. 15, 2011

Related U.S. Application Data

(63) Continuation-in-part of application No. 12/228,258, filed on Aug. 6, 2008, now Pat. No. 8,000,832.

(60) Provisional application No. 60/963,747, filed on Aug. 6, 2007.

(51) Int. Cl.
*G06F 11/00* (2006.01)
*G05B 19/4093* (2006.01)
(Continued)

(52) U.S. Cl.
CPC .. *G05B 19/4093* (2013.01); *G05B 2219/35188* (2013.01); *G06Q 10/06* (2013.01)

(58) Field of Classification Search
USPC .......... 703/2, 5, 7, 22; 700/97, 100, 107, 181, 700/182
See application file for complete search history.

(56) References Cited

U.S. PATENT DOCUMENTS

| 5,793,648 A | 8/1998 | Nagle et al. |
|---|---|---|
| 6,564,112 B1 | 5/2003 | Factor |

(Continued)

OTHER PUBLICATIONS

"U.S. Appl. No. 12/228,258 Restriction Requirement mailed Aug. 27, 2010", 10 pgs.

(Continued)

*Primary Examiner* — Thai Phan
(74) *Attorney, Agent, or Firm* — Haugen Law Firm PLLP

(57) ABSTRACT

The present inventors devised, among other things, systems, methods, and software that radically simplify and reduce the time necessary to specify, design, manufacture, and document control panels and wiring harnesses for semi-custom and custom equipment, such as HVAC equipment. A computer storage medium includes data relating to a plurality of control panel enclosures and a set of rules for designing a control panel. The system receives a selection of two or more components for placement in the control panel, retrieves information about the two or more components from a database, and generates one or more layouts. The one or more layouts comprise placement of the two or more components within at least one of the plurality of control panel enclosures as a function of the set of rules for designing a control panel. The control panel enclosures are dynamically selected as a function of the two or more components. The exemplary system dramatically reduces the product specification and engineering time required for any custom control panel and makes it possible for OEMs to efficiently offering more options and shorter turn-around times to its customers.

41 Claims, 28 Drawing Sheets
(3 of 28 Drawing Sheet(s) Filed in Color)

(51) Int. Cl.
*G06Q 10/06* (2012.01)
*G05B 19/40* (2006.01)

(56) References Cited

U.S. PATENT DOCUMENTS

| | | | |
|---|---|---|---|
| 6,687,557 | B2 | 2/2004 | Ouchi |
| 6,847,853 | B1 | 1/2005 | Vinciarelli et al. |
| 7,779,371 | B2 | 8/2010 | Lottmann |
| 8,000,832 | B1 | 8/2011 | Schmidtke et al. |
| 2004/0194019 | A1 | 9/2004 | Mast et al. |
| 2005/0080502 | A1 | 4/2005 | Chernyak et al. |
| 2005/0096774 | A1 | 5/2005 | Bayoumi et al. |
| 2005/0100934 | A1 | 5/2005 | Lee et al. |
| 2006/0055704 | A1 | 3/2006 | Kruk et al. |

OTHER PUBLICATIONS

"U.S. Appl. No. 12/228,258, Notice of Allowance mailed Dec. 28, 2010", 14 pgs.

"U.S. Appl. No. 12/228,258, Response filed Sep. 27, 2010 to Restriction Requirement mailed Aug. 27, 2010", 6 pgs.

EXEMPLARY
PANEL DNA STRUCTURE 400

| DATA FIELD # | CORRESPONDING PRODUCT OPTION | DATA FIELD LENGTH |
|---|---|---|
| 1 | MODEL NUMBER | 9 |
| 2 | VOLTAGE-PHASE-FREQUENCY | 3 |
| 3 | DISCONNECT | 1 |
| 4 | SUPPLY FAN QUANTITY | 1 |
| 5 | SUPPLY FAN CONTROL | 1 |
| 6 | SUPPLY FAN HP | 4 |
| 7 | SUPPLY FAN FLA# | 4 |
| 8 | EXHAUST FAN QUANTITY: 0, 1, 2 | 1 |
| 9 | EXHAUST FAN CONTROL | 1 |
| 10 | EXHAUST FAN HP | 4 |
| 11 | EXHAUST FAN FLA# | 4 |
| 12 | CONDENSING TYPE | 2 |
| 13 | CONDENSING FAN QTY# | 1 |
| 14 | CONDENSING FAN HP# | 4 |
| 15 | CONDENSING FAN FLA# | 4 |
| 16 | COMPRESSOR 1 QTY# | 1 |
| 17 | COMPRESSOR 1 TONS# | 4 |
| 18 | COMPRESSOR 1 FLA# | 4 |
| 19 | COMPRESSOR 1B QTY# | 1 |
| 20 | COMPRESSOR 1B TONS# | 4 |
| 21 | COMPRESSOR 1B FLA# | 4 |
| 22 | COMPRESSOR 2 QTY# | 1 |
| 23 | COMPRESSOR 2 TONS# | 4 |
| 24 | COMPRESSOR 2 FLA# | 4 |
| 25 | COMPRESSOR 2B QTY# | 1 |
| 26 | COMPRESSOR 2B TONS# | 4 |
| 27 | COMPRESSOR 2B FLA# | 4 |
| 28 | DAMPERS | 2 |
| 29 | GAS HEAT | 2 |
| 30 | GAS HEAT CONTROL | 2 |
| 31 | ELECTRIC TEMPERING COIL | 2 |
| 32 | GAS HEAT FURANCE QTY# | 1 |
| 33 | ELECTRIC HEAT | 2 |
| 34 | ELECTRIC HEAT kW# | 4 |
| 35 | HEAT RECOVERY | 2 |
| 36 | ENTHALPY WHEEL PHASE | 1 |
| 37 | ENTHALPY WHEEL HP# | 4 |
| 38 | ENTHALPY WHEEL FLA# | 4 |
| 39 | COMPRESSOR CRANKCASE HEATER | 1 |
| 40 | GFCI OUTLET | 1 |
| 41 | HEAD PRESSURE CONTROL | 1 |
| 42 | LOW AMBIENT CONTROL | 1 |
| 43 | STRIP HEATER | 1 |
| 44 | ENCLOSURE CONTROL | 1 |
| 45 | UV LIGHT | 1 |

EXEMPLARY PANEL DNA CODING TABLE

| OPTIONS | CODESTRING | LOOKUPCODE |
|---|---|---|
| MODEL NUMBER | 9 | |
| MODEL 1 | MDL110D05 | |
| MODEL 2 | MDL110D08 | |
| MODEL 3 | MDL110D10 | |
| MODEL 4 | MDL210D10 | |
| MODEL 5 | MDL210D13 | |
| MODEL 6 | MDL210D16 | |
| MODEL 7 | MDL210D18 | |
| MODEL 8 | MDL210D20 | |
| MODEL 9 | MDL210D25 | |
| MODEL 10 | MDL310D20 | |
| MODEL 11 | MDL310D25 | |
| MODEL 12 | MDL310D30 | |
| MODEL 13 | MDL310D35 | |
|  | MDL310D40 | |
| VOLTAGE-PHASE-FREQUENCY | 3 | |
| 200(208)V -3PH - 60Hz | 203 | |
| 230(240)V -3PH - 60Hz | 233 | |
| 460(480)V -3PH - 60Hz | 463 | |
| DISCONNECT | 1 | |
| NONE (POWER BLOCK) | N | |
| NON-FUSED DUSCONNECT | D | |
| FUSIBLE DISCONNECT | F | |
| CIRCUIT BREAKER | C | |
| FAN SUPPLY QUANTITY | 1 | |
| ONE | 1 | |
| TWO | 2 | |
| SUPPLY FAN CONTROL | 1 | |
| VFD | V | |
| MOTOR STARTER | S | |
| SUPPLY FAN HP | 4 | |
| 1/3HP | 00.3 | |
| 1/2HP | 00.5 | |
| 3/4 HP | 00.8 | |
| 1 HP | 01.0 | |
| 1.5 HP | 01.5 | |
| 2 HP | 02.0 | |
| 3 HP | 03.0 | |
| 5 HP | 05.0 | |
| 7.5 HP | 07.5 | |
| SUPPLY FAN FLA# | 4 | 2:6 |
| EXHAUST FAN QUANTITY | 1 | |
| NONE | 0 | |
| ONE | 1 | |
| TWO | 2 | |
| EXHAUST FAN CONTROL | 1 | |
| NONE | N | |
| VFD | V | |
| MOTOR STARTER | S | |
| EXHAUST FAN HP | 4 | |
| NONE | 00.0 | |
| 1/3HP | 00.3 | |
| 1/2HP | 00.5 | |
| 3/4 HP | 00.8 | |
| 1 HP | 01.0 | |
| 1.5 HP | 01.5 | |
| 2 HP | 02.0 | |
| 3 HP | 03.0 | |
| 5 HP | 05.0 | |
| 7.5 HP | 07.5 | |
| EXHAUST FAN FLA# | 4 | 2:10 |
| CONDENSING TYPE | 2 | |
| NONE | NA | |
| AIR COOLED | AC | |
| REMOTE CONDENSING | RC | |
| WATER COOLED | WC | |
| CHILLED WATER | CW | |
| SPLIT SYSTEM | SS | |
| HOT WATER | HW | |
| CONDENSING FAN QTY# | 1 | 1:12 |
| NONE | 0 | |
| ONE | 1 | |
| TWO | 2 | |
| THREE | 3 | |
| CONDENSING FAN HP# | 4 | 1:13 |
| CONDENSING FAN FLA# | 4 | 2:14 |

FIG. 4B

| FIG. 4B-1 |
| FIG. 4B-2 |

FIG. 4B-1

| OPTIONS | CODESTRING | LOOKUPCODE |
|---|---|---|
| COMPRESSOR 1 QTY# | 1 | 1:12 |
| COMPRESSOR 1 TONS# | 4 | 1:16 |
| COMPRESSOR 1 FLA# | 4 | 2:17 |
| COMPRESSOR 1B QTY# | 1 | 1:12 |
| COMPRESSOR 1B TONS# | 4 | 1:19 |
| COMPRESSOR 1B FLA# | 4 | 2:20 |
| COMPRESSOR 2 QTY# | 1 | 1:12 |
| COMPRESSOR 2 TONS# | 4 | 1:22 |
| COMPRESSOR 2 FLA# | 4 | 2:23 |
| COMPRESSOR 2B QTY# | 1 | 1:12 |
| COMPRESSOR 2B TONS# | 4 | 1:25 |
| COMPRESSOR 2B FLA# | 4 | 2:26 |
| DAMPERS | 2 | |
| NONE | NA | |
| OUTSIDE AIR | OA | |
| RETURN AIR | RA | |
| OUTSIDE AND RETURN AIR | OR | |
| GAS HEAT | 2 | |
| NONE | NA | |
| YES | GH | |
| GAS HEAT CONTROL | 2 | |
| NO CONTROL | NC | |
| 2-STATE | TS | |
| MODULATING | MD | |
| ELECTRIC TEMPERING COIL | 2 | |
| NONE | NA | |
| SCR CONTROL | SC | |
| GAS HEAT FURANCE QTY# | 1 | 1:29 |
| ELECTRIC HEAT | 2 | |
| NONE | NA | |
| YES | EH | |
| ELECTRIC HEAT kW# | 1 | 1:33 |
| HEAT RECOVERY | 2 | |
| NONE | NA | |
| ENTHALPY WHEEL NO SENSOR | EH | |
| ENTHALPY WHEEL WITH ROTATION SENSOR | ER | |
| FLAT PLATE HEAT EXCHANGER WITH BYPASS DAMPER | FB | |
| FLAT PLATE HEAT EXCHANGER WITH MODULATING BYPASS DAMPER | FM | |
| ENTHALPY WHEEL PHASE | 1 | |
| SINGLE PHASE | S | |
| THREE PHASE | T | |
| ENTHALPY WHEEL HP# | 4 | 35:36 |
| ENTHALPY WHEEL FLA# | 4 | 2:37 |
| COMPRESSOR CRANKCASE HEATER | 1 | |
| NONE | N | |
| CRANKCASE HEATER | H | |
| GFCI OUTLET | 1 | |
| NONE | N | |
| DRC OUTLET | O | |
| DRC TRANSFORMER IN SEPARATE ENCLOSURE | T | |
| HEAT PRESSURE CONTROL | 1 | |
| NONE | N | |
| YES | Y | |
| LOW AMBIENT CONTROL | 1 | |
| NONE | N | |
| YES | Y | |
| STRIP HEATER | 1 | |
| NONE | N | |
| STRIP HEATER IN PANEL | H | |
| ENCLOSURE COOLING | 1 | |
| NONE | N | |
| COOLING FAN IN PANEL | C | |
| UV LIGHT | 1 | |
| NONE | N | |
| YES | L | |

*FIG. 4B-2*

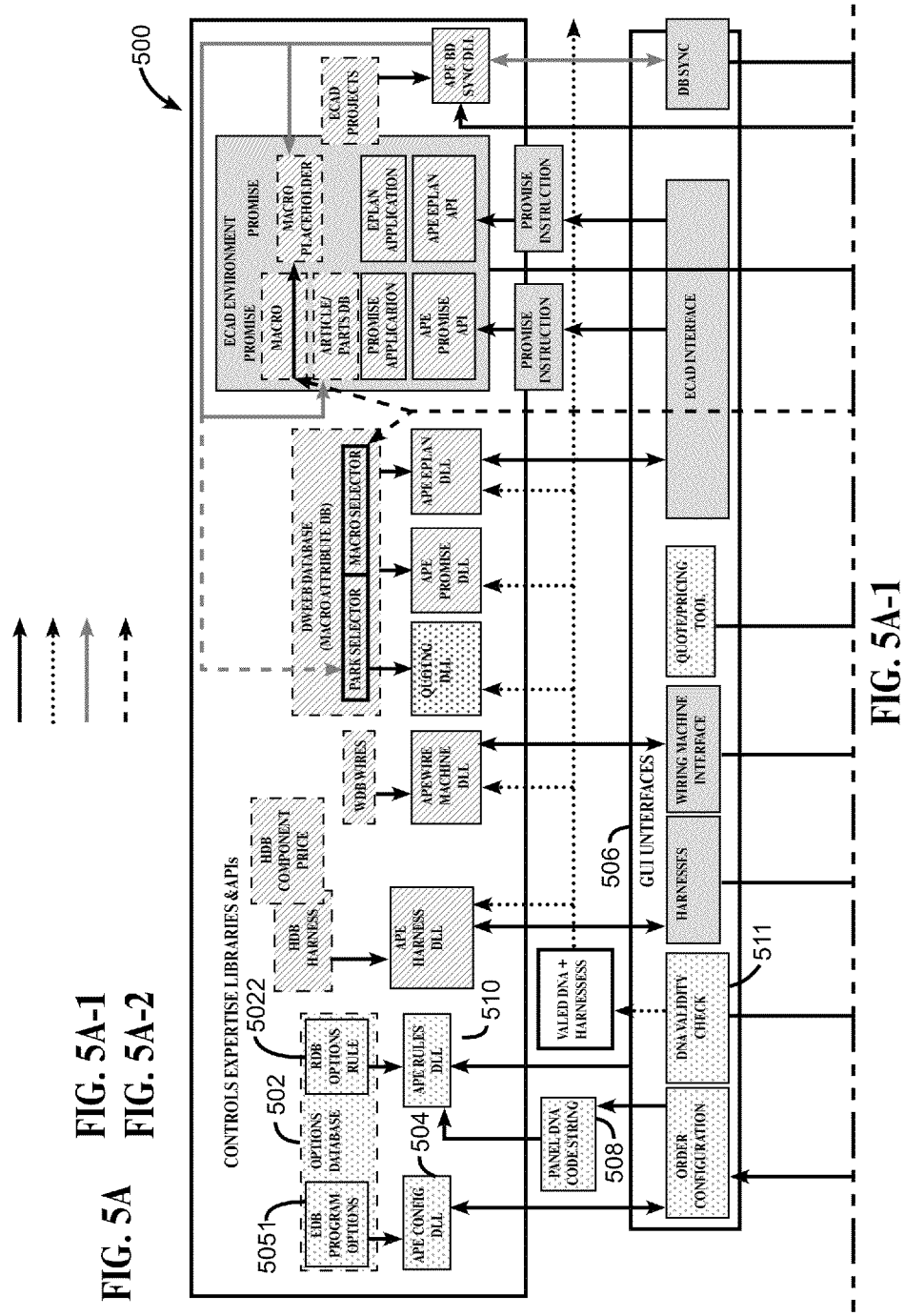

EXEMPLARY
EDB PROGRAM OPTIONS GUI

600

Microsoft Excel-EDB [Read-Only]

File  Edit  View  Insert  Format  Tools  Data  Window  Help

B103   fx  COMPRESSOR 1B FLA#

| | A | B | C | D | E | F | G |
|---|---|---|---|---|---|---|---|
| 18 | 2 | VOLTAGE-PHASE-FREQUENCY | 3 | | | | |
| 19 | 2a | 200(208)V - 3PH - 60Hz | 203 | | | | |
| 20 | 2b | 230(240)V - 3PH - 60Hz | 233 | | | | |
| 21 | 2c | 460(480)V - 3PH - 60Hz | 463 | | | | |
| 22 | 2EOL | | | | | | |
| 23 | 3 | DISCONNECT | 1 | | | | |
| 24 | 3a | NONE (POWER BLOCK) | N | | | | |
| 25 | 3b | NON-FUSED DISCONNECT | D | | | | |
| 26 | 3c | FUSIBLE DISCONNECT | F | | | | |
| 27 | 3d | CIRCUIT BREAKER | C | | | | |
| 28 | 3EOL | | | | | | |
| 29 | 4 | SUPPLY FAN QUANTITY | 1 | | | | |
| 30 | 4a | ONE | 1 | | | | |
| 31 | 4b | TWO | 2 | | | | |
| 32 | 4EOL | | | | | | |
| 33 | 5 | SUPPLY FAN CONTROL | 1 | | | | |
| 34 | 5a | VFD | V | | | | |
| 35 | 5b | MOTOR STARTER | S | | | | |
| 36 | 5EOL | | | | | | |
| 37 | 6 | SUPPLY FAN HP | 4 | | | | |
| 38 | 6a | 1/3 HP | 00.3 | | | | |
| 39 | 6b | 1/2 HP | 00.5 | | | | |
| 40 | 6c | 3/4 HP | 00.8 | | | | |
| 41 | 6d | 1 HP | 01.0 | | | | |
| 42 | 6e | 1.5 HP | 01.5 | | | | |
| 43 | 6f | 2 HP | 02.0 | | | | |
| 44 | 6g | 3 HP | 03.0 | | | | |
| 45 | 6h | 5 HP | 05.0 | | | | |
| 46 | 6i | 7.5 HP | 07.5 | | | | |
| 47 | 6EOL | | | | | | |
| 48 | 7 | SUPPLY FAN FLA# | 4 | 2:6 | | | |

PRODUCT LINE 1 / PRODUCT LINE 1_CLT / PRODUCT LINE 1_RLT

Ready

*FIG. 6*

EXEMPLARY RULES DATABASE STRUCTURE

| | A | B | C | D | E |
|---|---|---|---|---|---|
| 1 | S/N | OPTIONS | CONDITION | LOGICAL OPERATOR | ERROR CODE |
| 2 | 1 | 2=M | 5>0320 | | Err2.M_5.0320 |
| 3 | EOR1 | | | | |
| 4 | 2 | 2=M | 7<>1 | AND | Err2.M_7.1_8.1 |
| 5 | | 7=3 | 8<>1 | | |
| 6 | EOR2 | | | | |
| 7 | 3 | 2=M | 4<>203 | | Err2.M_4_203 |
| 8 | EOR3 | | | | |
| 9 | 4 | 6=P | 4=573 | AND | Err6P_4.573_3.N |
| 10 | | 4=573 | 3<>N | | |
| 11 | EOR4 | | | | |
| 12 | 5 | 6=Q | 4=573 | AND | Err6Q_4.573_3.N |
| 13 | | 4=573 | 3<>N | | |
| 14 | EOR5 | | | | |
| 15 | 6 | 6=R | 4=573 | AND | Err6R_4.573_3.N |
| 16 | | 4=573 | 3<>N | | |
| 17 | EOR6 | | | | |
| 18 | 7 | 6=S | 4<>463 | OR | Err6S_4.463_3.N |
| 19 | | 6=S | 4=573 | AND | |
| 20 | | 4=573 | 3<>N | | |
| 21 | EOR7 | | | | |
| 22 | 8 | 6=T | 4<>463 | OR | Err6T_4.463_3.N |
| 23 | | 6=T | 4=573 | AND | |
| 24 | | 4=573 | 3<>N | | |
| 25 | EOR8 | | | | |
| 26 | 9 | 6=U | 4<>463 | OR | Err6U_4.463_3.N |
| 27 | | 6=U | 4=573 | AND | |
| 28 | | 4=573 | 3<>N | | |
| 29 | EOR9 | | | | |
| 30 | 10 | 8=N | 2<>N | | Err8.N_2.N |
| 31 | EOR10 | | | | |
| 32 | 11 | 8=I | 2<>C | OR | Err8.1_2.C/M |
| 33 | | 8=I | 2<>M | | |
| 34 | EOR11 | | | | |
| 35 | 12 | 8=E | 2=N | | Err8.E_2.N |
| 36 | EOR12 | | | | |
| 37 | 13 | 12=1 | 3=N | | Err12.1_3.N |
| 38 | EOR13 | | | | |
| 39 | END OF RULES | | | | |

Column A:
- Each and every rule should start with a numeric value.
- Each rule should end with "EOR" and a rulenumber.
- "ENDOFRULES" should denote the end of all the rules Column B:
- This column contain: code number =option
- Operators allowed are
  - =
  - <>(not equal to)
  - >=
  - <=
  - >
  - <

Column C:
- This column contains conditions in the following format: Code Number < > Option
- Operators allowed are
  - =
  - <>(not equal to)
  - >=
  - <=
  - >
  - <

Column D:
- This column contains logical operator that operates two rows.
- Operators allowed are
  - AND
  - OR
  - XOR Column E:
- This column contains Error codes.
- Rule Number and Error codes should be placed in the same row.

Note: the logical operator between OPTIONS and CONDITIONS is always AND.

Column A contains rule numbers, ENDOFRULES statements, etc.
Column B: Options
Column C: Conditions
Column D: Logical Operators
Column E: Error Codes

FIG. 9

| DEVICE TAG | MFG PART NUMBER |
|---|---|
| CBL1 | C45-72 |
| CR3 | RPM41F7 |
| CR3 | RPZF4 |
| CR3 | 8WH9150-0CA00 |
| CR5 | RPM41F7 |
| CR5 | RPZF4 |
| CR7 | RPM41F7 |
| CR7 | RPZF4 |
| CR7 | 8WH9150-0CA00 |
| CR8 | RPM41F7 |
| CR8 | RPZF4 |
| CR9 | RPM41F7 |
| CR9 | RPZF4 |
| CR10 | RPM41F7 |
| CR10 | RPZF4 |
| DOB1 | XB4BD33 |
| DOB1 | DRC 006844 |
| DPT1 | 2641010WD11TIC |
| DPT1 | DRC 001260 |
| DS1 | GS1GU3 |
| DS1 | GS1AE21 |
| DS1 | GS1AH430 |
| DS1 | DRC 001261 |
| DS1 | D03000201 |
| DS1 | LPJ-45-SP |
| DS1 | 349927664 |
| DS3 | GS1EU3 |
| DS3 | GS1AD020 |
| DS3 | DRC 001261 |
| DS3 | LPJ-30-SP |
| DS3 | 349927661 |
| DS3 | D03000201 |
| DS4 | GS1EU3 |
| DS4 | GS1AD020 |
| DS4 | DRC 001261 |
| DS4 | LPJ-30-SP |
| DS4 | 349927661 |
| DS4 | D03000201 |
| F1A | FNQ-R-4 |
| F1B | FNQ-R-4 |
| F1C | FNQ-7 |
| FAN1 | OA172SAP-11-1TBXC |
| FAN1 | RHA4000G |

*FIG. 11A*

| DEVICE TAG | MFG PART NUMBER |
|---|---|
| FAN1 | G172-10HA |
| FAN1 | RH40000LG |
| FAN1 | 193422601 |
| FAN1 | 193422501 |
| FAN1 | 349937605 |
| FAN1 | 349937603 |
| FB50 | 6M30A1SQ |
| FB50 | CC630 |
| FB50-FU50C | FNQ-20 |
| FU50 | CCP-2-30CC |
| FU50 | FNQ-R-12 |
| FU50 | DRC 010492 |
| FU50 | 193403801 |
| GLG1 | 2/0TP |
| GLG1 | DRC 001433 |
| GLG1 | DRC 001264 |
| GLG2 | 2/0TP |
| GLG2 | DRC 001433 |
| GLG2 | DRC 001264 |
| GLG3 | 2/0TP |
| GLG3 | DRC 001433 |
| GLG3 | DRC 001264 |
| GRD1 | PK4GTA |
| GRD1 | 349939009 |
| LR1 | KDRC3H |
| LR1 | DRC 001277 |
| LR1 | DRC 001276 |
| LR1 | DRC 001258 |
| LR2 | KDRC3H |
| LR2 | DRC 001277 |
| LR2 | DRC 001276 |
| LR2 | DRC 001258 |
| LT1 | ZB4BV043 |
| LT1 | ZB4BVG4 |
| LT1 | DRC 006844 |
| LT2 | ZB4BV043 |
| LT2 | ZB4BVG4 |
| LT2 | DRC 006844 |
| LT3 | ZB4BV043 |
| LT3 | ZB4BVG4 |
| LT3 | DRC 006844 |
| LT4 | ZB4BV063 |
| LT4 | ZB4BVG6 |

*FIG. 11B*

| DEVICE TAG | MFG PART NUMBER |
|---|---|
| CBL1 | C45-72 |
| CR3 | RPM41F7 |
| CR3 | RPZF4 |
| CR3 | 8WH9150-0CA00 |
| CR5 | RPM41F7 |
| CR5 | RPZF4 |
| CR7 | RPM41F7 |
| CR7 | RPZF4 |
| CR7 | 8WH9150-0CA00 |
| CR8 | RPM41F7 |
| CR8 | RPZF4 |
| CR9 | RPM41F7 |
| CR9 | RPZF4 |
| CR10 | RPM41F7 |
| CR10 | RPZF4 |
| DOB1 | XB4BD33 |
| DOB1 | DRC 006844 |
| DPT1 | 2641010WD11TIC |
| DPT1 | DRC 001260 |
| DS1 | GS1GU3 |
| DS1 | GS1AE21 |
| DS1 | GS1AH430 |
| DS1 | DRC 001261 |
| DS1 | D03000201 |
| DS1 | 349927664 |
| DS1 | GTT-2-2-W/C |
| DS1 | LPJ-45-SP |
| DS3 | GS1EU3 |
| DS3 | GS1AD020 |
| DS3 | DRC 001261 |
| DS3 | LPJ-30-SP |
| DS3 | 349927661 |
| DS3 | D03000201 |
| DS4 | GS1EU3 |
| DS4 | GS1AD020 |
| DS4 | DRC 001261 |
| DS4 | LPJ-30-SP |
| DS4 | 349927661 |
| DS4 | D03000201 |
| EXHAUST | G172-10HA |
| F1A | FNQ-R-4 |
| F1B | FNQ-R-4 |
| F1C | FNQ-7 |

*FIG. 16A*

| DEVICE TAG | MFG PART NUMBER |
|---|---|
| FAN1 | OA172SAP-11-1TBXC |
| FAN1 | G172-10HA |
| FAN1 | 193422601 |
| FAN1 | 193422501 |
| FAN1 | 349937605 |
| FAN1 | 349937603 |
| FB50 | 6M30A1SQ |
| FB50 | CC630 |
| FB50-FU50C | FNQ-20 |
| FU50 | CCP-2-30CC |
| FU50 | FNQ-R-12 |
| FU50 | DRC 010492 |
| FU50 | 193403801 |
| GLG1 | 2/0TP |
| GLG1 | DRC 001433 |
| GLG1 | DRC 001264 |
| GLG2 | 2/0TP |
| GLG2 | DRC 001433 |
| GLG2 | DRC 001264 |
| GLG3 | 2/0TP |
| GLG3 | DRC 001433 |
| GLG3 | DRC 001264 |
| GRD1 | PK4GTA |
| GRD1 | 349939009 |
| LR1 | KDRC3H |
| LR1 | DRC 001277 |
| LR1 | DRC 001276 |
| LR1 | DRC 001258 |
| LR2 | KDRC3H |
| LR2 | DRC 001277 |
| LR2 | DRC 001276 |
| LR2 | DRC 001258 |
| LT1 | ZB4BV043 |
| LT1 | ZB4BVG4 |
| LT1 | DRC 006844 |
| LT2 | ZB4BV043 |
| LT2 | ZB4BVG4 |
| LT2 | DRC 006844 |
| LT3 | ZB4BV043 |
| LT3 | ZB4BVG4 |
| LT3 | DRC 006844 |
| LT4 | ZB4BV063 |
| LT4 | ZB4BVG6 |

*FIG. 16B*

\*\*\* Group Name: VFD\*\*\*
 Located on the following panel: BP
 Placed at 0% of total panel width
 Placed at 0& of total panel height
 X Alignment: Left
 Y Alignment: Top Parts In this Group:
 Total Parts: 6
  \*\*\* Device ID: VFD<> \*\*\*
 Type of part: VFD
 Dinrail Preference: Default
 This part can be placed relative to the following parts
 Total Relative Parts: 1
  \*\*\* Relative Part: VFD<->:VFD \*\*\*
  Placed on side: Right
  0% across relative part
  Min of part is placed
  X coordinate is placed relative to this part
  Y coordinate is placed relative to this part \*\*\* Device ID: GLG<1-49> \*\*\*
 Type of part: GLG
 This part can be placed in the padding of other parts
 This part is rotated by DRC.DynamicLayout.Data.Angle degrees
 Dinrail Preference: Default
 This part can be placed relative to the following parts
 Total Relative Parts: 1
  \*\*\* Relative Part: VFD<-1>:VFD \*\*\*
  Placed on side: Bottom
  0.5 inches of additional space added between parts
  0% across relative part
  Min of part is placed
  X coordinate is placed relative to this part
  Y coordinate is placed relative to this part \*\*\* Device ID: VFD1 \*\*\*
 Type of part: VFD
 An absolute location will be used for this part
 Place 0 inches from left side of this group
 Place 0 inches from top of this group
 Dinrail Preference: Default \*\*\* Device ID: DPT<> \*\*\*
 Type of part: PS
 This part is rotated by DRC.DynamicLayout.Data.Angle degrees
 Dinrail Preference: Default
 This part can be placed relative to the following parts
 Total Relative Parts: 3

*FIG. 17A*

* Relative Part: DPT<->:PS *
Placed on side: Top
0% across relative part
Min of part is placed
X coordinate is placed relative to this part
Y coordinate is placed relative to this part

* Relative Part: VFD1:VFD *
Placed on side: Left
100% across relative part
Max of part is placed
X coordinate is placed relative to this part
Y coordinate is placed relative to this part

* Relative Part: VFD<+>:VFD *
Placed on side: Left
100% across relative part
Max of part is placed
X coordinate is placed relative to this part
Y coordinate is placed relative to this part

* Device ID: HEATWHEEL *
Type of part: VFD
Dinrail Preference: Default
This part can be placed relative to the following parts
Total Relative Parts: 1
    * Relative Part: VFD<MAX>:VFD *
Placed on side: Right
0% across relative part
Min of part is placed
X coordinate is placed relative to this part
Y coordinate is placed relative to this part

* Device ID: GLG50 *
Type of part: GLG
This part can be placed in the padding of other parts
This part is rotated by DRC.DynamicLayout.Data.Angle degrees
Dinrail Preference: Default
This part can be placed relative to the following parts
Total Relative Parts: 1
    * Relative Part: HEATWHEEL:VFD *
Placed on side: Bottom
0.5 inches of additional space added between parts
0% across relative part
Min of part is placed
X coordinate is placed relative to this part
Y coordinate is placed relative to this part

*FIG. 17B*

SYSTEMS, METHODS, AND SOFTWARE FOR AUTOMATED DESIGN AND MANUFACTURING OF HVAC CONTROL PANELS

RELATED APPLICATION

The present application claims priority to U.S. Provisional Application 60/963,747, which was filed on Aug. 6, 2007, and U.S. application Ser. No. 12/228,258, which was filed on Aug. 6, 2008, and now issued as U.S. Pat. No. 8,000,832. These applications are incorporated herein by reference.

COPYRIGHT NOTICE AND PERMISSION

A portion of this patent document contains material subject to copyright protection. The copyright owner has no objection to the facsimile reproduction by anyone of the patent document or the patent disclosure, as it appears in the Patent and Trademark Office patent files or records, but otherwise reserves all copyrights whatsoever. The following notice applies to this document: Copyright© 2007, Design Ready Controls, Inc.

TECHNICAL FIELD

Various embodiments of the present invention concern automated design and manufacture of equipment control panels, such as control panels for heating ventilation and air conditioning (HVAC) equipment. Some embodiments also concern control panels and other subassemblies, such as wiring harnesses, for the design and manufacture of pumps, large compressors, conveyors, packaging, and air-handling equipment.

BACKGROUND

Equipment, such as HVAC equipment, is manufactured by Original Equipment Manufacturers (OEMs) which have a variety of customers with differing needs. To meet these needs efficiently, OEMs develop semi-custom product lines, or product families, for particular market segments. Customers then select among various lists of parameters, configurations, and options of the product family to order semi-customized equipment in much the same way as automobile buyers customize their automobiles by choosing among available options.

For example, an HVAC equipment customer might choose among parameters, such as cooling capacities and electrical supply voltages, and among configurations, such as numbers and sizes of supply and exhaust fans. By selecting particular parameters, configurations, and options, the customer is ultimately choosing a single product from thousands or even millions of unique possibilities.

Once the HVAC customer has committed to its selections by placing an order, an HVAC OEM typically completes the order using an ETO (Engineer To Order) process. Specifically, this process entails passing the order to a team of engineers, who study the selections and adapt or customize a generic electrical and mechanical design to incorporate the customer selections. Among other things, this customization effort frequently requires redesigning the electrical control panel of the HVAC equipment.

However, one problem recognized by the current inventors is that conventional control panel redesign is particularly time consuming and expensive because the control panel functions as the brains of the HVAC equipment, and includes hundreds of interconnected components. This added time and expense places significant pressure on OEMs to limit the range of options they offer customers in a market where many customers are actually wanting more options and lower pricing.

Moreover, because of this timing and pricing pressure, many OEMs have sought to shorten the conventional design and manufacture process by skipping steps such as fully documenting their control panel designs with accurate as-built drawings. However, the lack of these drawings creates the further problem of making it difficult to service and troubleshoot HVAC equipment after installation.

Accordingly, the present inventors have identified a need for better ways of designing and manufacturing OEM equipment generally, and HVAC control panels particularly.

SUMMARY

To address this and/or other needs, the present inventors devised, among other things, systems, methods, and software that radically simplify and reduce the time necessary to specify, design, manufacture, and document control panels for semi-custom or even fully custom OEM equipment, such as control panels and wiring harnesses for HVAC equipment. One exemplary computerized system includes a product-configuration module, a technical-design module, and a manufacturing module.

In operation, the product-configuration module receives user input about product family parameters through a specialized configuration interface, and outputs a product family data structure, for example a coded character string analogous to human DNA, to the technical-design module. The technical-design module, which incorporates engineering design rules, automatically processes the coded character string, outputting true as-built engineering drawings, component listings, wiring listings, and even assembly instructions for robotic manufacturing equipment. The manufacturing module receives output of the technical-design module, generates and orders parts using an enterprise resource planning system, and communicates assembly instructions to robotic manufacturing equipment.

The exemplary system dramatically reduces the product specification and engineering time required for any custom control panel and makes it possible for OEMs to efficiently offer more options and shorter turn-around times to its customers and thus enjoy a significant competitive advantage.

BRIEF DESCRIPTION OF DRAWINGS

The patent or application file contains at least one drawing executed in color. Copies of this patent or patent application publication with color drawing(s) will be provided by the Office upon request and payment of the necessary fee.

FIG. 4A is a tabular rendition of an exemplary control panel DNA data structure which corresponds to one of more embodiments of the present invention.

FIG. 4B is a tabular rendition of an exemplary option-to-coded-string translation table corresponding to one or more embodiments of the present invention.

FIG. 6 is a facsimile of exemplary graphical user interface 600 corresponding to one or more embodiments of the present invention.

FIG. 9 is a facsimile of exemplary graphical user interface (and database structure) 900 corresponding to one or more embodiments of the present invention.

FIGS. 11A and 11B are an example embodiment of a bill of materials for a control panel.

FIGS. 16A-16B are an example of a bill of materials.

FIGS. 17A and 17B are an example of a control panel component profile.

DETAILED DESCRIPTION OF EXEMPLARY EMBODIMENT(S)

This description, which incorporates the Figures and the claims, describes one or more specific embodiments of an invention. These embodiments, offered not to limit but only to exemplify and teach the invention, are shown and described in sufficient detail to enable those skilled in the art to implement or practice the invention. Thus, where appropriate to avoid obscuring the invention, the description may omit certain information known to those of skill in the art.

Overview

The exemplary system and method embody a unique approach to the design and manufacture of control panels for custom OEM (original equipment manufacturer) products, particularly custom HVAC equipment. Conventionally, OEMs develop and offer families of products that address particular market segments. For example, OEM's that produce HVAC equipment typically offer a family or range of products. Within a product family, OEM customers choose from a relatively large number of options. Within each product family, millions of permutations or potentially unique option combinations are generally possible. Because of this variability in product configuration, each OEM product ordered is considered to be at least somewhat unique or custom in terms of content and design.

To bring a highly variable product family to market, an OEM typically operates as follows:
1) Recognize a market opportunity.
2) Define specifications for a product family that meets the opportunity.
3) Detail and design engineering for the product family
4) Provide list of options for customers to choose from
5) Finalize the design and layout as each individual order is received (ETO engineer to order process)
6) Manufacture, test and deliver product to customer specifications.

Development of the controls subsystem or control panel for the product family follows the same process, specifically steps 2-6.

The exemplary control panel design and manufacturing system streamlines the upfront development of control panels for such OEM product families (steps 2, 3 and 4), automates the ETO process (step 5), and provides the manufacturing information and reports necessary for the just-in-time mass production of custom controls panels for OEM products (step 6).

Exemplary Control Panel Design and Manufacturing System

Figure 1:
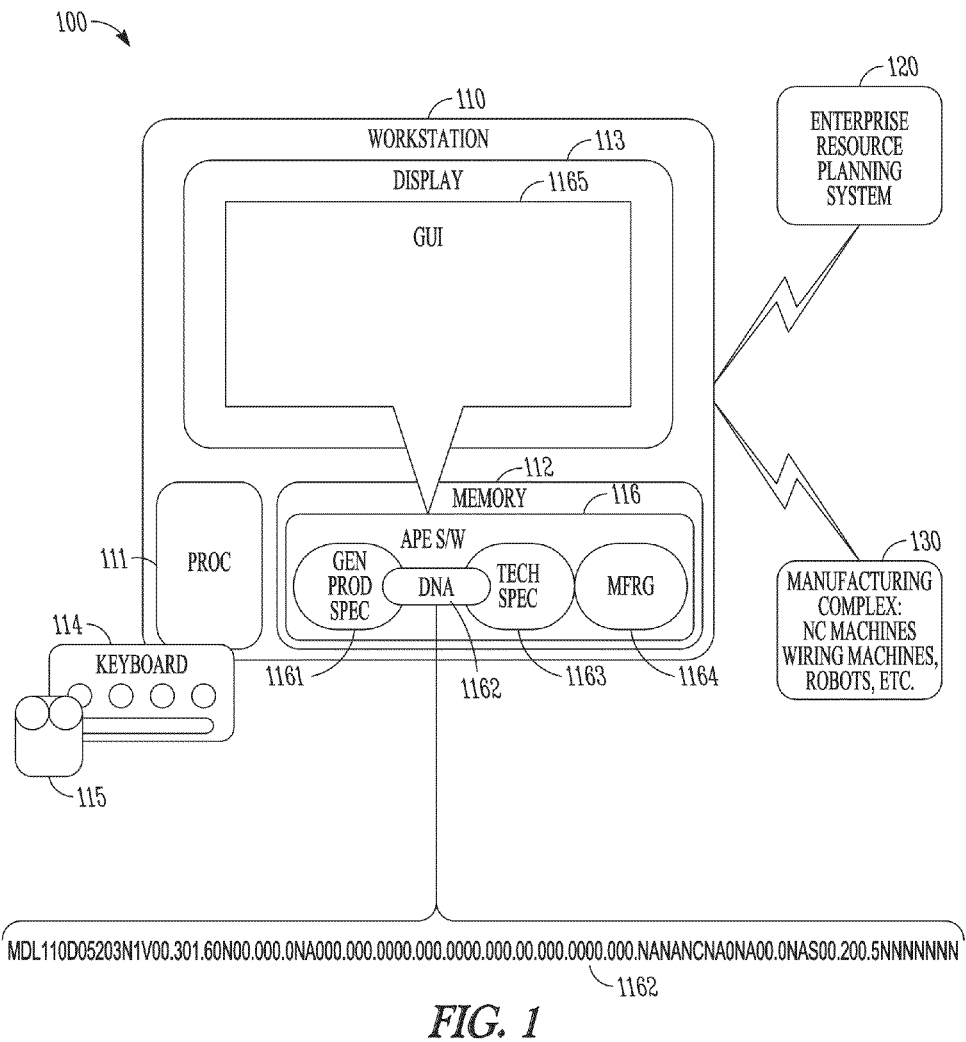
FIG. 1 is a block diagram of an exemplary control panel design and manufacturing system 100, which corresponds to one or more embodiments of the present invention.

FIG. 1 shows an exemplary control panel design and manufacturing support system 100. System 100 includes a computer workstation 110, an enterprise resource planning (ERP) system 120, and a manufacturing complex 130. In the exemplary embodiment, access device 110 takes the form of a personal computer, laptop computer, personal digital assistant, mobile telephone, or any other devices capable of supporting the functionality described herein. Specifically, workstation 110 includes a processor module 111, a memory 112, a display 113, a keyboard 114, and a graphical pointer or selector 115.

Processor module 111 includes one or more processors, processing circuits, or controllers. In the exemplary embodiment, processor module 111 takes any convenient or desirable form. Coupled to processor module 111 is memory 112.

Memory module 112, which takes the exemplary form of one or more electronic, magnetic, or optical data-storage devices, stores automated panel expert (APE) design and manufacturing module 116.

Module 116, which includes machine readable and/or executable instruction sets and related data, includes a general product specification module 1161, a product definition data structure 1162, technical specification module 1163, manufacturing support module 1164, and associated graphical user interfaces 1165.

General product (control panel) specification (or configuration) module 1161 includes instruction sets and data for producing one or portions of graphical user interface (GUI) 1165, accepting user input related to attributes of an HVAC system, and defining and outputting general product specification data structure (DNA) 1162 based on the selected attributes or on imported attributes or requirements. In the exemplary embodiment, general product specification data structure takes the form of an encoded text string, which is validated based on options-compatibility rules. DNA 1162 is output to technical specification module 1163.

Technical specification module 1163 decodes DNA 1162 into various fields or segments. These segments are used in automatically selecting components and defining mechanical and electrical schematics for a product, such as an HVAC control panel, using design rules and macros for computer-aided-design tools.

Manufacturing module 1164, which receives the mechanical and electrical schematics, includes instructions sets and data for not only defining one or more portions of GUI 1165, such as ECAD interfaces, but also defining wiring lists, mechanical layouts, ERP order administration, etc.

In addition to workstation 110, system 100 includes ERP system 120 and manufacturing complex 130, both of which interface with manufacturing module 1164 to facilitate just-in-time mass production of HVAC control panels and associated wiring harnesses.

Exemplary Method of Operation

Figure 2:
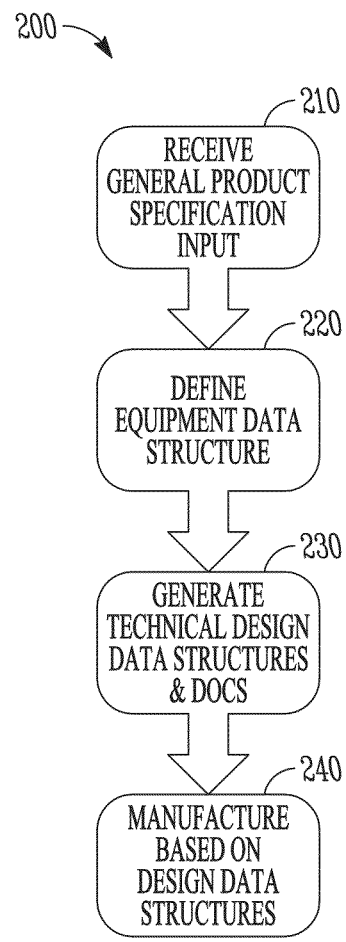
FIG. 2 is a flow chart of an exemplary method of operating system 100, which corresponds to one or more embodiments of the invention.

FIG. 2 shows a flowchart of an exemplary method 200 of operating a system 100 in FIG. 1. Flow chart 200 includes blocks 210-240, which are arranged and described serially. However, other embodiments execute two or more blocks in parallel using multiple processors or processor-like devices or a single processor organized as two or more virtual machines or sub processors. Other embodiments also alter the process sequence or provide different functional partitions or blocks to achieve analogous results. Moreover, still other embodiments implement the blocks as two or more interconnected hardware modules with related control and data signals communicated between and through the modules. Thus, the exemplary process flow applies to software, hardware, and firmware implementations.

Figure 3:
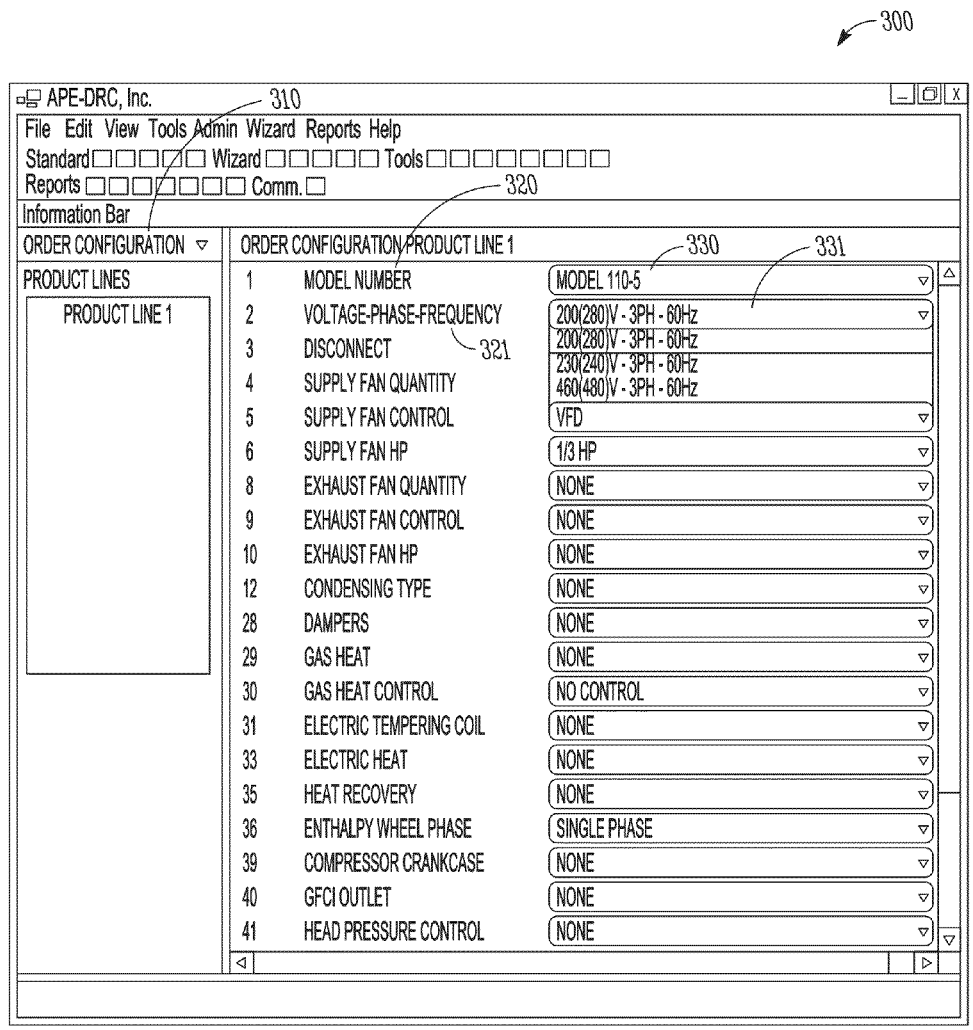
FIG. 3 is a facsimile of exemplary graphical user interface 300 corresponding to one or more embodiments of the present invention.

The exemplary method begins at block 210, which entails receiving input defining a set of product options. In the exemplary embodiment, this entails displaying a product definition or configuration interface portion of GUI 1165 which lists a variety product selection option. FIG. 3 shows an exemplary configuration interface 300.

Configuration interface 300 includes a product line listing region 310, a feature listing region 320, and a corresponding feature definition region 330. Product line listing region lists one or more selectable product lines. Feature listing region 320 lists a set of features or attributes, such as voltage-phase-frequency attributes 321, which associated with the active or selected product line within region 310. Feature definition region 330 includes a set of feature definition regions, such as pull-down menu 331, which corresponds to the voltage-phase-frequency attributes 321. Pull-down menu 331 lists selectable options. Execution continues at block 220.

Block 220 entails defining an equipment data structure based on the selected product options. In the exemplary embodiment this entails defining a DNA data structure in the form of a coded text string based on the selections made using configuration interface portion of GUI 1165 or interface 300.

FIG. 4A shows a tabular rendition of an exemplary DNA data structure 400, which includes 45 data fields, each associated with a particular user-selected or otherwise defined OEM product option, such as an OEM HVAC system. In the exemplary character-string implementation, each data field is associated with a position within the character string and has a predetermined number of characters representative of some aspect of an OEM HVAC system that affects its control panel (and wiring harness.) For example, data field #1 is 9 characters long and defines the model number of the HVAC system; data field #2 is 3 characters long and defines some aspect of the voltage-phase-frequency of the HVAC system with the selected model number; data field #3 defines some aspect of the HVAC disconnect and has a length of one character. In the exemplary embodiment, the data field number also indicates its cardinal position within a concatenated text string.

In defining the DNA structure based on the selected options, the exemplary embodiment uses a translation data structure or table. FIG. 4B shows an exemplary translation data structure 450, which is stored in memory of the exemplary system. Translation data structure 450 includes options 452, code strings 454, and lookup codes 456. In the exemplary system, one or more of the user selections for the configuration menu is calculated based on other selected parameters or selected from a lookup table using a lookup coding scheme that either addresses a predetermined value or a formula for determining a value. (In the exemplary embodiment, DNA coding table 450, implemented as a spreadsheet or database, is also used to define the content and sequencing of menus and menu listings in the configuration interface. Thus, changing the position of the model number options within the spreadsheet changes its position within interface 300.) An exemplary control panel DNA data structure follows:

```
MDL110D05203N1V00.301.60N00.000.0NA000.000.0000.000.0000.
                       000.00.0000.000.0NANANCNA00.0NAS00.200.5NNNNNNN
```

The exemplary method also entails validating the DNA data structure using validation rules, specifically ensuring that the selected options presented in the DNA data structure are compatible based on options rules. Some embodiments perform validation during general product specification on a selection-by-selection basis, alerting the user whenever a given selection is incompatible with a prior selection, or alternatively narrowing the available feature space as the user moves through the configuration interface.

FIG. 2 shows that after defining an equipment data structure based on the selected product options, execution continues at block 230.

Block 230 entails automatically generating technical design data structures and documentation based on the defined (and validated) equipment data structure (which is representative of the general product specification.) In the exemplary embodiment, this generally entails defining a parts lists based on the DNA data structure, generating electrical and mechanical schematics based on ECAD macros for the parts and related macro attributes logically associated with parts and one or more portions of the DNA data structure, such as model number or product line.

Block 240 entails automatically manufacturing a piece of equipment, in this case a control panel, based on the technical design data structures. In the exemplary embodiment, manufacturing entails defining wiring lists, mechanical layouts, etc. and communicating relative instructions sets to one or more automated or robotic manufacturing devices, such as wiring machine, laser cutter, or milling machine, to complete the desired control panel. Additionally, automated testing is performed.

Further structural and operational details are described below in relation to an exemplary software architecture.

Exemplary Software Architecture

Figures 2, 5A:
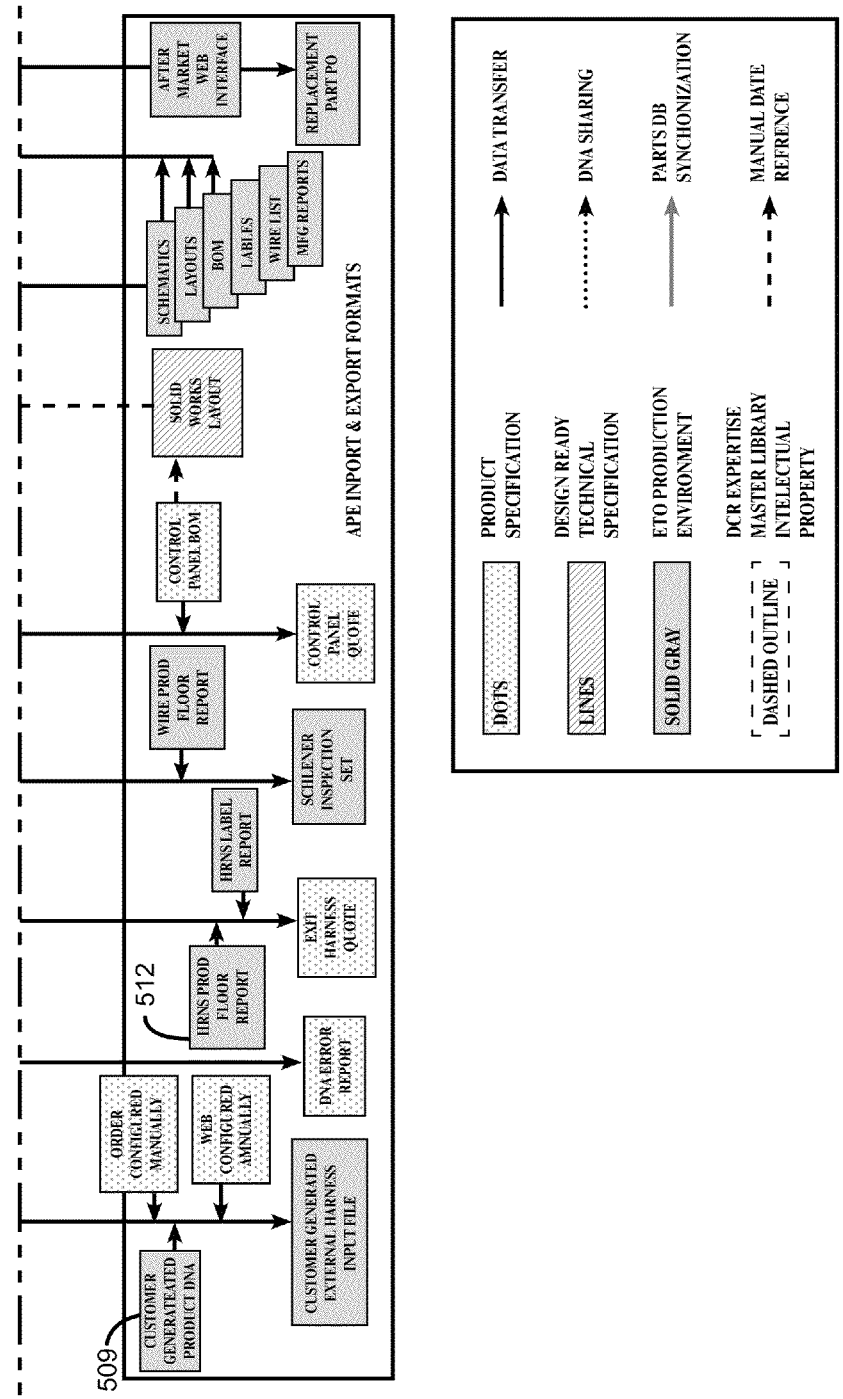
FIGS. 5A and 5B are combination flow and block diagrams, which taken together, represent an exemplary architecture 500 that corresponds to one or more embodiments of the present invention.
Figure 5B:
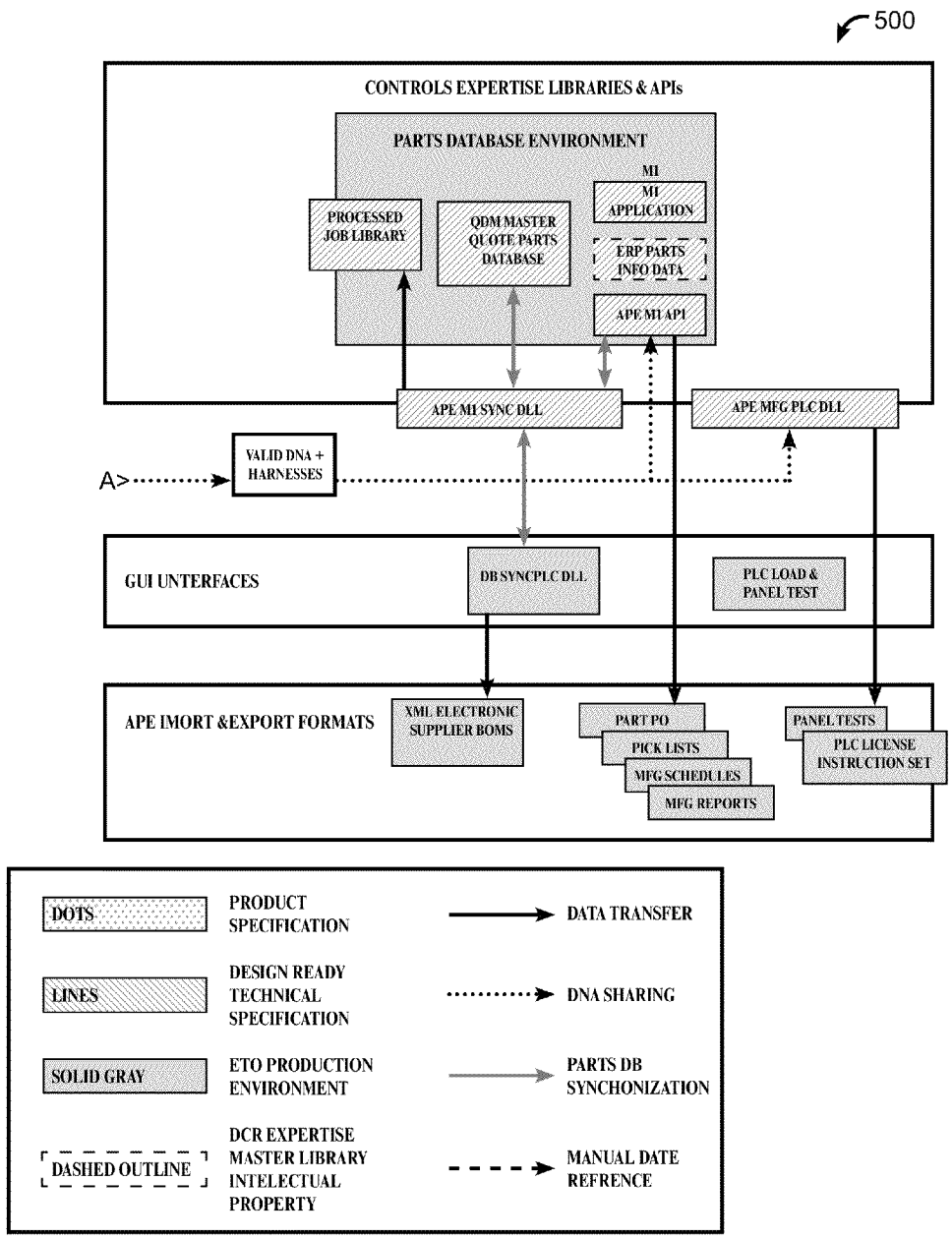

FIGS. 5A and 5B shows an architectural block and flow diagram of an exemplary implementation 500 of software 116 in FIG. 1. These two figure shows three sets of color coded components, with the green components generally corresponding to module 1161, the yellow components corresponding to module 1163, and the blue components corresponding to module 1164. Flow through the diagram is generally left to right.

General Product Specification

In operation, the exemplary method starts with presenting a "design ready" list of common technical options (EDB PROGRAM OPTIONS 202) found within an OEM industry such as HVAC, pump, large compressor, conveyor, packaging or air handling etc. For example, an HVAC OEM can select options for a range of supply fans based on horsepower. (FIGS. 3 and 4 shows respective graphical user interfaces 300 and 400 for selecting options.)

By choosing from this list of options and limiting the available selections within each option, the OEM can use the exemplary system to quickly define and generate the general engineering specifications for a product family (Step 2 in Overview). In the exemplary embodiment, the OEM can further develop the engineering product family specifications by adding to this list any additional options that may be unique to its offering.

Because the system helps reduce the time and cost of upfront product development (Step 3) and ETO (step 5), OEMs are often able to economically expand the number and variety of product family options (EDB PROGRAM OPTIONS 2021). Once a set of options is defined, the system defines a DNA code string or data structure 208 (analogous to DNA 1162 in FIG. 1) that effectively captures the customized order from the OEM's customers.

More specifically, in the exemplary embodiment, an APE CONFIG DLL module 503, reads the original engineering specifications from an OPTIONS DATABASE 502 and automatically defines a Control Panel DNA data structure 508) for the product family.

To capture an order, the exemplary system configures the EDB PROGRAM OPTIONS preselected by an OEM into a dynamic GUI interface list, such as GUI 300 in FIG. 3 This GUI is used for manually configuring orders (Step 4) through the selection of control panel options (ORDER CONFIGURATION, ORDER CONFIGURED MANUALLY). Selection listed in the GUI 300 are populated from an EDB program options database 5051. FIG. 6 shows that the EDB program options database can take the form of an Excel spreadsheet; however, some embodiments use a SQL database format.

The EDB program options database contains the list of options or parameters that are used to define translation table in FIG. 4B, which as noted earlier to translate selected equipment options into the DNA code string for a control panel. Some of these options are displayed dynamically through the configuration interface in FIG. 3 when someone configures a control panel. These are the options highlighted in yellow in FIG. 4. The ones highlighted in orange/tan are calculated on the fly or using lookup tables kept in other Microsoft Excel spreadsheet files. In many cases, the user need not be prompted. For example, the exemplary embodiment calculates amperage if we prompt for voltage and horsepower. In this case, the DNA strand will show horsepower, voltage and amperage even though we only prompted the user for horsepower and voltage. All of the parameters are used to complete the fields in the DNA strands. EDB files are fully customizable for each individual customer's control panel requirements The exemplary system offers a unique link between how a customer views requirements and how these requirements translate into a set of engineering specifications in the form of a PANEL DNA CODE STRING. For example, a customer may view a requirement as the need for an HVAC system for a 25,000 sq. ft. warehouse, and the exemplary system ultimately translates this into an engineering requirement of an HVAC system having 4 units of a specified capacity with each unit having 5 hp supply fans.

The exemplary system presents options to a customer in a menu using customer friendly language and then uses RDB OPTIONS RULES 5022 within OPTIONS DATABASE 502 to translate or map the customer requirements into the engineering requirements. For example, the system can query a customer for the size of warehouse they need air conditioned and in response select an appropriate quantity and product recommendation based on model number. From the model number, the exemplary system provides further rules to select more detailed engineering criteria such as supply fan horsepower etc. This automated translation from customer requirements to engineering specifications enables the OEM to quickly identify customer requirements and instantly provide customized engineering specifications including quotes and bills of material (BOMs).

In exemplary embodiment, APE CONFIG DLL 504 used to map customer requirements and configure orders into Panel DNA code string 508 can also be embedded or called directly from an OEM's internal order entry software as represented by CUSTOMER GENERATED PRODUCT DNA 509. The APE GUI interface can be hosted on a web server to define a WEB CONFIGURED ORDER 510, allowing OEM customers to order products from anywhere via a wide- or local-area network.

To detect and allow correction of compatibility issues between selected options, APE RULES.DLL 510 reads the list of options selected within PANEL DNA CODE STRING 508 and dynamically checks for errors and option incompatibilities, using engineering rules within RDB OPTIONS RULES database 5022 to validate each potential order. DNA VALIDITY CHECK interface 511 is used in concert with the ORDER CONFIGURATION interface 506 to guide OEM sales personnel and their potential customers through the order configuration process. (In some embodiments, the APE RULES.DLL can also be used in concert with and be directly called from an OEM's internal order-entry software tool.)

Figure 7:
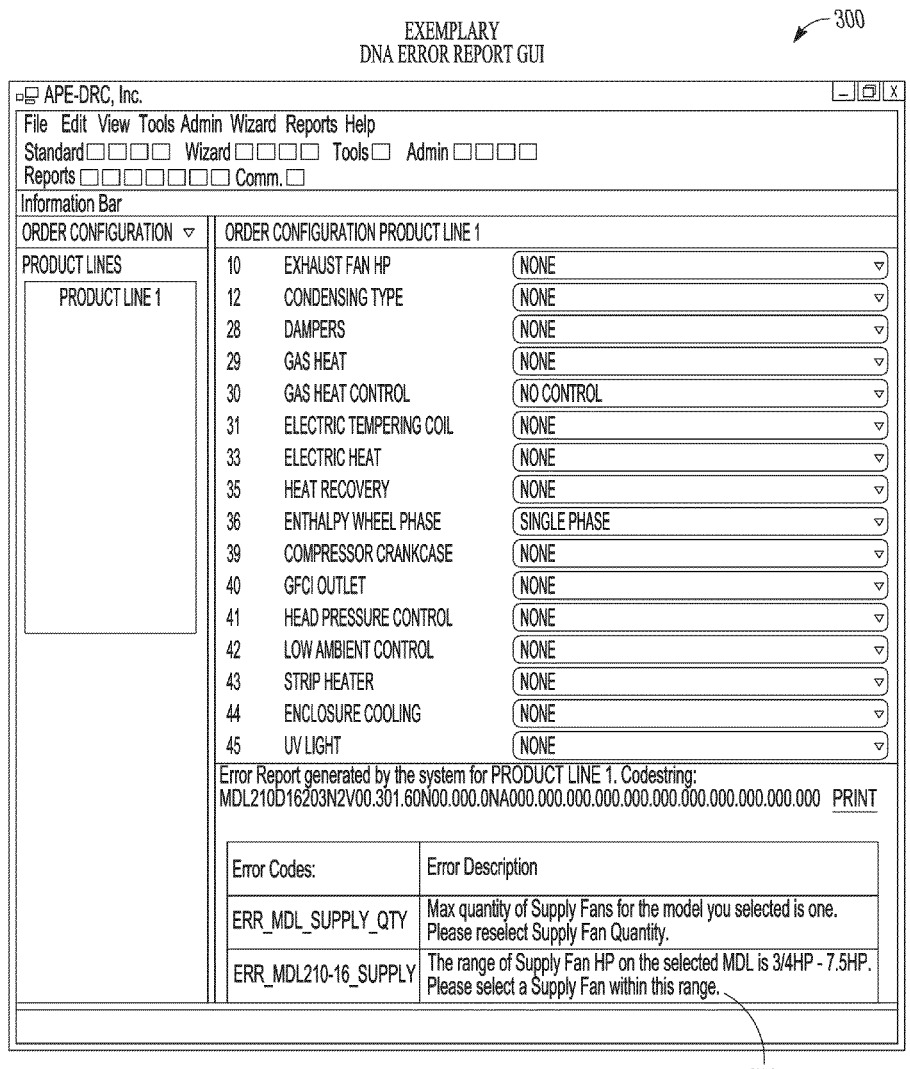
FIG. 7 is a facsimile of exemplary graphical user interface 700 corresponding to one or more embodiments of the present invention.

More specifically, RDB OPTIONS RULES database 5022 includes a series of if/then Boolean operations that point to fields in the PANEL DNA CODE STRING. For example if field one equals 30 (which could stand for a model number 30 pump control) then perhaps field 2 cannot be X, Y, or Z (which could represent certain types of disconnects). Each rule violation points to an error message that can be dynamically displayed to the user as a DNA ERROR REPORT 512 from the DNA VALIDITY CHECK interface 512. For example; "Error you cannot have a type X, Y or Z disconnect in a model 30 product." FIG. 7 shows an exemplary DNA error report GUI 700 (300), with an error message region 710.

Figure 8:
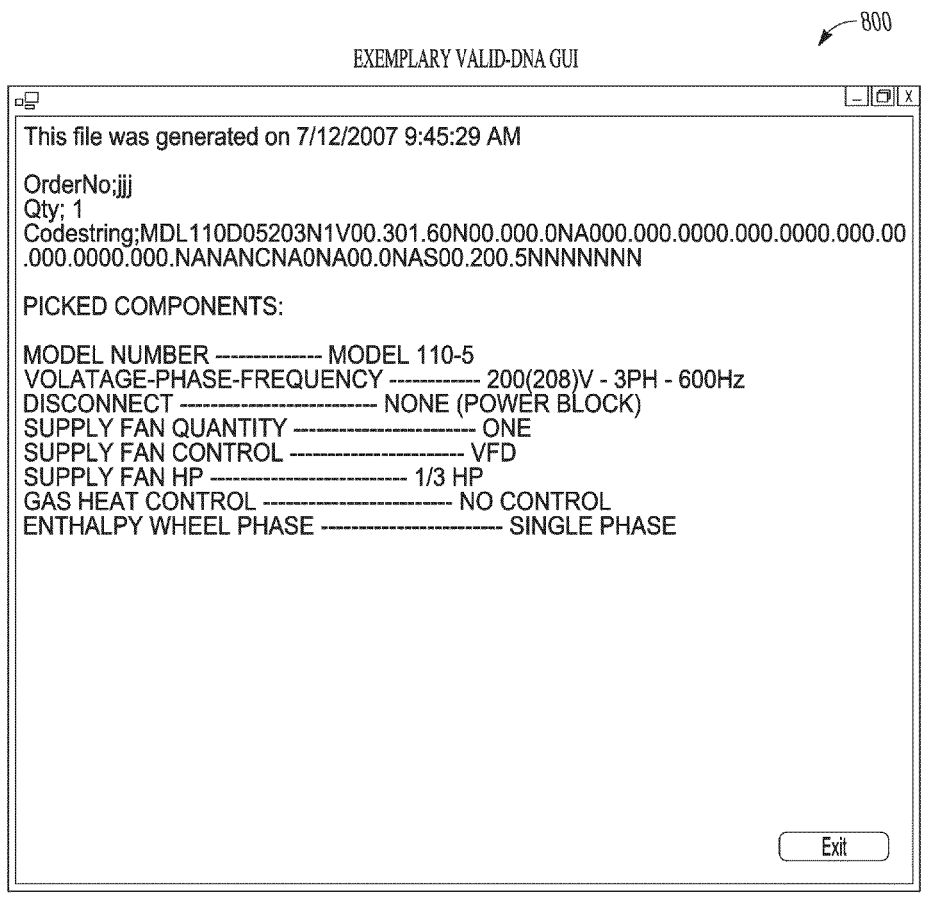
FIG. 8 is a facsimile of exemplary graphical user interface 800 corresponding to one or more embodiments of the present invention.

When APE RULES.DLL 510 determines that all the rules in RDB OPTION RULES database 5022 have been met for a particular order defined by PANEL DNA CODE STRING 508, it validates the DNA code string and clears the order, now captured in the VALID DNA format, for use with the automated ETO processing tools. FIG. 8 shows an exemplary valid DNA GUI 800 that is output in response to a validity confirmation.

FIG. 9 shows an exemplary spreadsheet version 900 of RDB option rules database 5022. The rules are set up as complex sets of IF-THEN statements of the form IF (DNA code (=, <, >, etc) some calculated value) THEN (select size, part, macro, wire, etc). (Rules of this form can also be created and managed using off-the-shelf applications such as Rules Stream expert-system software.)

These are the rules that are executed against a DNA code string. In some cases the rules describe DNA code compatibility and which options may or may not work with others. In this case they are used in the DNA error checking routines that validate a desired configuration or DNA code string. In other instances these rules are used to select and size components that go into a control panel. For example if the DNA code for hp=30 then a motor starter of a certain size from a particular vender will be selected. When we use the RDB format for such selections we sometimes refer to the file as a DWEEEB database.

Detailed Technical Design Specification

The upfront engineering of the controls for an OEM family of products typically involves creating the following:

A) A series of general yet detailed electrical schematics that cover the options and basic controls functions necessary for the OEM product family.

B) A complete list of all the components and parts that are potentially needed to complete the control panels for an entire OEM product family.

C) A detailed scheme for the physical layout, of the parts from step B, for the family of control panels.

The exemplary process and software tools are designed to help streamline the upfront detailed design process (Steps A, B & C) and automate the ETO process. The exemplary system automates the process in such a way that the detailed design information from steps A, B and C are captured (MACRO OBJECT DB, APE MASTER ENGINEERING PARTS DB and MACROS along with ETO engineering or decision making expertise (DWEEEB database with electrical engineering and estimating brains DATABASE) within the system. The system incorporates off-the-shelf, 3D solid-modeling applications (SOLIDWORKS 3D LAYOUT) for interference checking and the development of a layout scheme. (Step C).

The detailed design process (steps A, B, C) is therefore streamlined to a standardized process of selecting appropriate generic macros and rules and augmenting them with any additional data necessary to complete the design of the controls for a family of products. (Note: ECAD macros are small schematic or layout drawings that can be picked, placed and linked into complete schematic and layout drawings.) Once populated with the detail design information and ETO rules, the exemplary system completely automates the ETO process and produces as-built schematics, as-built layouts, BOMs, and a host of manufacturing reports for each unique panel at the touch of a button (SCHEMATICS, LAYOUTS, BOM, LABELS, WIRE LISTS, MFG REPORTS).

Automated Manufacturing

In general terms, the exemplary system captures the expertise and criteria used by ETO engineers and processes orders (VALID DNA) with this information. Instead of an engineer handing off marked up schematics to a drafter, the exemplary system uses the APE GUI ECAD INTERFACE, APE (APE PROMISE DLL, APE EPLAN DLL) to create an ECAD instruction set (PROMISE INSTRUCTION SET, EPLAN INSTRUCTION SET) that can be executed through the API (application programming interface) of standard off the shelf ECAD drafting packages (APE PROMISE API, APE EPLAN API). Through the APIs, as-built schematics and layouts can be generated with the touch of a button or via a single command or call from another application. The schematics and layouts are then efficiently checked for errors and completeness utilizing standard utilities available within the ECAD packages (ECAD ENVIRONMENT).

The exemplary system includes a unique populated master parts database (APE MASTER ENGINEERING PARTS DB) that is associated with a unique set of macro information or MACRO OBJECT DATA BASE and a catalog of ECAD macros (MACROS, MACROS/PLACEHOLDER).

Electrical CAD systems such as PromisE, EPLAN or AutoCAD electric use the concept of Macros or sub drawings that can be quickly accessed to build up larger or complete schematics. In addition to the graphical representation, each software vender allows data or attributes to be assigned to a macro. This information can include items such as part numbers of components, wire numbers, wire gauge, wire colors, harness designations, schematic page and X,Y location coordinates, device IDs, connection point labels, wire terminations, strip lengths, wire lengths, etc.

Conventional macros contain this type of attribute information on a product family basis. Thus, conventional macro catalogs normally need to be recreated for each different product family or schematic and layout design. However, the present inventors recognized the inefficiency of this approach and devised a unique MACRO OBJECT DATABASE that captures, maintains and manages ECAD macro attribute information. This allows one to create truly generic catalogs of macros (with generic placeholders for the attribute information) for all off-the-shelf ECAD packages. These generic macros can be used repeatedly across various OEMs and across various product families as well as schematic and layout configurations. Once generic macros are placed, information specific to the product family can be assigned to the macros from the MACRO OBJECT DATABASE.

The benefits and efficiencies of this unique approach are many. The need to redraw and manage macros used for specific product families is reduced. An original design manufacturer can share generic macros across product families and customers reducing upfront development costs. ECAD attribute data is managed independently from any specific ECAD software application, thus allowing the ability to change an APE installation from one ECAD software vender to another. And by managing the attribute data within a sophisticated database utility, such as the Microsoft SQL utility, the data is much easier to maintain, update and revise. And those that maintain this attribute data can do so directly without having to access or even know how to access the ECAD software applications, again reducing engineering time, resources and expertise required for implementing initial installations of the APE system or future engineering changes in a product family.

Associated with each part in the master library and with each macro is a set of rules (DWEEEB DATABASE) that describe what parts and what macros may be selected for any given VALID DNA code string. The rules include a series of if/then Boolean operations, which once satisfied point to a part (PARTS SELECTOR) to be included in the BOM or a macro (MACRO SELECTOR) to be included in the as-built SCHEMATICS or LAYOUTS.

As the APE PROMISE DLL or APE EPLAN DLL processes each rule (DWEEEB DATABASE) against an order (VALID DNA), instruction sets for the picking and placing of macros and the assignment of parts (PROMISE INSTRUCTION SET, EPLAN INSTRUCTION SET) and ECAD attributes are generated as input for the ECAD systems (PROMISE APPLICATION, EPLAN APPLICATION). Through the ECAD APIs, (APE PROMISE API, APE EPLAN API), the instruction sets are automatically executed and as-built drawings, BOMs and manufacturing reports (SCHEMATICS, LAYOUTS, BOM, LABELS, WIRE LISTS, MFG REPORTS) are generated without the need for manual intervention (ECAD INTERFACE). Results are verified within the ECAD ENVIRONMENT and then electronically sent to the appropriate manufacturing group (ECAD INTERFACE).

As-built manufacturing reports (SCHEMATICS, LAYOUTS, BOM, LABELS, WIRE LISTS, MFG REPORTS are archived (PROCESSED JOB LIBRARY) using the APE DB SYNC DLL and DB SYNC interface for future aftermarket and support access (AFTER MARKET WEB INTERFACE, REPLACEMENT PART PO).

The handling of macros is a notable aspect of the exemplary system. In contrast to conventional ECAD systems which bundle macros and macro attributes, the exemplary embodiments effectively separates them, storing product-line-specific macro attributes in a separate database that can be called by the ECAD APIs. The ECAD systems include the drawings macros for relevant components along with their conventional macro attributes; however, when ECAD APIs in the exemplary embodiment call for a particular macro from an ECAD program, they also call for or retrieve a set of product-line-specific macro attributes from the macro attribute database (DWEEEB in FIG. 5A). The conventional macro attributes are ignored or overridden by the ECAD API according to the product-line-specific macro attributes. Thus, in the exemplary embodiment, ECAD macros can be paired with multiple sets of product-specific macro attributes that effectively redefine the macro as necessary to facilitate the production of schematics and as-built drawings for not only multiple product lines of a given OEM, but also across the product lines of multiple OEMs.

The overall advantages to this system includes ETO turnaround times measured in minutes versus days or even weeks, fewer human touches and therefore fewer errors in the drafting process, complete manufacturing and after-market support specifications in the form of as-built drawings, BOMs and manufacturing reports (SCHEMATICS, LAYOUTS, BOM, LABELS, WIRE LISTS, MFG REPORTS), and a system that continually improves through the iterative process of quality control.

Extensions

Pricing Tool Extensions

Pricing information can optionally be added to the master parts list (ERP PARTS INFO DB). Along with PARTS SELECTOR rules, the exemplary system uses a QUOTING DLL and QUOTING/PRICING TOOL GUI interface to calculate and display pricing information (CONTROL PANEL BOM, CONTROL PANEL QUOTE) when the sales organization configures an order (VALID DNA). This capability to generate instant quotes at the time an order is configured for custom control panels is another competitive advantage.

Harness and Wire Processing Extensions

If control panels can be thought of as the brains and the OEM product as the body, then harnesses that connect the brains to the body can be seen as the nervous system. For each potential control panel within an OEM product family, there is a unique set of corresponding harnesses that are required to connect the control panel to the OEM product.

The exemplary system includes a harness parts and pricing rules database (HDB HARNESS, HDB COMPONENT PRICE) that is processed (HARNESSES GUI) with the APE HRNS DLL to create both quotes (EXT HARNESS QUOTE) and manufacturing reports (HRNS PROD FLOOR REPORT, HRNS LABEL REPORT) for the external harnesses. Harness production floor reports may include instruction sets for use with automated wire processing machines.

While most of the harness information can be captured in a design ready format, the lengths of the harnesses are dependant on the size, shape and electrical routing within the ordered OEM equipment. Through the exemplary system, OEMs can choose to include this additional harness information (CUSTOMER GENERATED EXTERNAL HARNESS INPUT FILE) along with the control panel configuration (VALID DNA+HARNESS).

In addition to harnesses data, a set of control panel wire information (WDB WIRES) can also be created for the product family. This set of data/rules is used by the APE WIRE MACHINE DLL to compile a manufacturing wire report (WIRE PRODUCTION FLOOR REPORT) and a set of instructions for an automated wire process machine. The exemplary embodiment supports the Schleneger brand of wire machine (SCHLENEGER INTERFACE, SCHLENEGER INSTRUCTION SET), but the system architecture allows that others such as Komax can added. The use of automated wire processing machines drastically reduces the time to cut, strip, label and terminate wires.

Database Synchronization

The exemplary system manages and synchronizes the databases used through out the specification, detailed design, ETO process and manufacturing process (Steps 2-6) and future aftermarket activities. Through the PARTS DATABASE ENVIRONMENT and the DB SYNC GUI interface, APE establishes industry libraries of design-ready data, manages historic production data, and synchronizes information with internal, supplier and customer order to remittance applications.

The exemplary system also helps differentiate and manage both commercial and engineering data for parts. On the commercial side, the system recognizes a central ERP (enterprise resource planning) system as the source for current parts, pricing and scheduling information (M1 APPLICATION).

While the ERP system specializes in commercial information, there is still a need to manage the engineering data such as part specifications, mounting whole locations, connection point specifications etc. In many cases, the ECAD software applications have proprietary database utilities to manage this type of parts data. Similar to the MACRO OBJECT DATABASE, the exemplary system employs a more generic APE ENGINEERING PARTS DB that can manage generic parts data across multiple product families, customers, vendors and ECAD software applications, all while being seamlessly synchronized with an ERP system.

The exemplary system uses this information (ERP PARTS INFO DATA) to populate and refresh the design ready master libraries (MACRO OBJECT DB, ENGINEERING PARTS DB and DWEEEB DATABASE PARTS SELECTOR). Through the DB SYNC interface, the APE DB SYNC DLL extracts information from the ERP system (APE M1 API), combines this information with the APE ENGINEERING PARTS DB and is makes all necessary data available and accessible by the ECAD ENVIRONMENT, QUOTING TOOLS, MFG REPORTS generation such as BOMs, and aftermarket part selection utilities such as the AFTER MKT WEB INTERFACE.

As orders enter the ETO engineering process, the orders are in parallel managed from a supplier and order-to-remittance perspective. Electronic communication from the exemplary system generates purchase orders (Pos) for components (PART PO) and automatically sends them to suppliers, manages inventories (XML ELECTRONIC SUPPLIER BOMS, PICK LISTS), and coordinates schedules (MFG SCHEDULES, MFG REPORTS) between the manufacturing department and OEM customer.

As jobs are complete through the automated ETO process embodied within the system, manufacturing reports (SCHEMATICS, LAYOUTS, BOM, LABELS, WIRE LISTS, MFG REPORTS) and project data (ECAD PROJECTS) are stored in a PROCESSED JOB LIBRARY. This library can in turn be accessed through the DB SYNC interface for future reference. An additional web portal (AFTER MKT WEB INTERFACE) to this historic project data is available for aftermarket support and the generation of REPLACEMENT PART POs.

Final Test and PLC Logic

The exemplary system also assists in the final programming and testing of the panel before it leaves for the OEM customer. Once the panel is assembled, the APE PLC LOAD AND TEST interface utilizes the APE MFG PLC DLL to download the correct controller instructions (PLC LICENSE INSTRUCTION SET) to the panels PLC (programmable logic controller) and then tests the panel to make sure it is functionally correctly (PANEL TEST). Thus, testing protocols or instructions are dynamically loaded to match the particulars of any given panel under test.

Full Customization

The exemplary system enables "true custom" design and manufacturing by providing for manual interface into the ECAD applications. Specifically, the system can be used to define a semicustom product using the configuration interface to define a product DNA structure and develop a detailed technical design, including ECAD schematics. The ECAD schematics can then be manually modified to include options not available in the configuration interface. Once the schematics are fully customized with these options, they and related BOMs, etc can be generated as with any product defined fully in the configuration interface. This customization process also applies to mechanical layout and enclosure dimensioning and design, with the exception that 2D or 3D modeling software can be used to manually or automatically generate layouts and enclosure designs after determination of electrical schematics and BOMs. The system can process these technical design using its manufacturing and ERP automation as with semicustom designs.

Dynamic Generator

An embodiment can be referred to as a "Dynamic Control Panel Layout." This embodiment is an extension to the Automated Panel Expert (APE) system disclosed above.

As noted above, an embodiment of the APE system takes a unique set of control panel options (control panel configuration) and creates a functional as-built schematic, as-built drawing (layout), a bill of materials (BOM), and manufacturing reports for a unique control panel. This is accomplished by preconfiguring the APE expert system with all the rules necessary to first select the necessary components and enclosure from a predefined master list of components and a predefined list of enclosures, and then configuring the resulting BOM of parts into a functional as-built schematic and as-built drawing (layout).

With the APE system as disclosed above, an up-front engineering analysis of a predetermined list of standard enclosures are utilized to predetermine a set of rules that assign fixed locations for every selectable component from the master list to each of the preselected enclosures.

When the APE system is executed, based on the options selected, a BOM for a specific control panel is selected from the master components list. A separate set of enclosure selection rules is then used to choose an appropriate enclosure from the predefined enclosure list. The APE system then selects the appropriate predetermined fixed location (derived from the up-front analysis described in the previous paragraphs) for the combination of each part in the BOM and the selected enclosure. This location information is then utilized to automatically produce an as-built layout drawing of the unique control panel.

In an embodiment, the dynamic layout generation technology takes the concept of generating as-built layouts one step further. The new dynamic control panel layout technology extends an embodiment of an APE system described above with a uniquely architected rules base for the generation of dynamic enclosure layouts. Dynamic enclosure layouts refer to layouts wherein the selected components are placed efficiently into any number of dynamically selected or available enclosures or available spaces. With the dynamic layout generation technology, enclosures no longer need to be preselected and the need for an up-front engineering analysis is no longer necessary to populate an expert system with specific location data to create an as-built layout.

APE systems were initially developed to automate the manual engineering required for the production of unique control panels for high volume Original Equipment Manufacturers (OEM) that produce highly variable machines. In this environment, the overall design of the OEM's machine may result in a limited space for a control panel to reside. For these highly customized machines it is not possible to preselect appropriate enclosures because the resulting space available for the enclosure and where it is to be placed is unknown ahead of time. In these instances, in order to automate the manual process of laying out components into a custom-shaped enclosure with limited space, a new technology and approach is desirable.

An embodiment of a Dynamic Control Panel Layout technology differs from the approach used in a typical APE expert-system described above. A typical APE system requires an up-front engineering analysis and the manual input of specific detailed information for each combination of potential components and potential enclosures that could potentially be used in a control panel.

The dynamic control panel layout technology interface is built not on a large number of predetermined specifics, but on general rules (profile) that were previously manually exercised by the engineers as they performed the up-front engineering analysis described above. These rules are now harnessed within the new dynamic control panel layout expert-system architecture and can be dynamically executed by an APE system, thus automating fully custom control panel layouts.

There are several advantages to this approach. The time necessary to configure the layout portion of the APE expert system is reduced, and the APE system now has the ability to select the most appropriate enclosure from a dynamically changing list of different sized enclosures, or it can create a layout designs for a truly custom available space.

The dynamic control panel layout technology uses profiles. A profile is a captured set of the general rules previously utilized during the up-front design process. Up-front rules are those typically applied by experienced control panel engineers in the course of their day to day work. For example, the engineer may in general want to place disconnect components in the center and at the top of a panel. In general, the engineer may run the power wires out the bottom of the enclosure and in general place a set of terminal blocks on a horizontal strip of din rail somewhere in between. A complete set of these general rules that are utilized in an overall control panel program for an OEM is called a profile. A complete set refers to all the rules necessary to group and place all potential components into an enclosed space.

During the traditional up-front design process, through the use of a traditional off the shelf Computer Aided Design (CAD) application, the engineer would apply these general rules over and over again in determining the predefined specific data required for each combination of potential component and potential enclosure.

Figure 10:
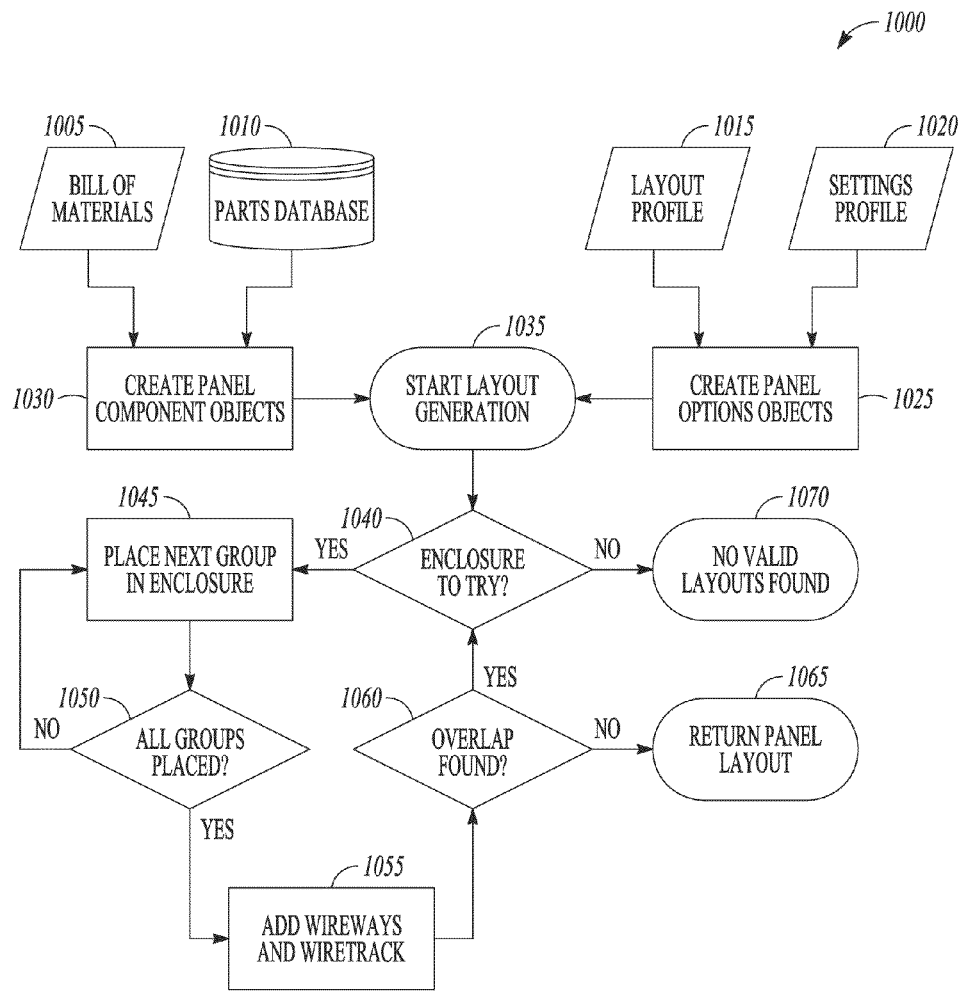
FIG. 10 is a block diagram of an example embodiment of a dynamic generator for a control panel.

With an embodiment of the Dynamic Control Panel Layout technology, an engineer utilizes a unique method in the form of a software tool to capture the general rules once, instead of having to implement them manually over and over again. A complete description of this unique method and software tool is described below. An embodiment of the Dynamic Control Panel Layout technology is illustrated in FIG. 10.

Once a profile is defined, an embodiment of the Dynamic Generator system can utilize the profile by sequentially selecting components from the BOM, applying the general rules within the profile, and placing the part within the layout. An example of a BOM is illustrated in FIGS. 11A-11B.

Information for each component such as the size, shape, mounting information, macro drawing, connection point location, etc. is stored in a parts database. This is general information about the component itself and not specific in any way to the control panel or enclosure in which it is being placed. Once in the library, the data can be utilized within any number of control panels or Dynamic Generator systems. In one or more embodiments, the library includes general component information in the sense that it only ever has to be entered into the library once, and then the information can be utilized over and over again for multiple control panels generated from multiple Dynamic Generator systems for multiple programs for multiple OEMs.

Once the Dynamic Generator system places all the components from the BOM in a selected enclosure, the system checks for overlaps. If one or more overlaps are found, the system can move to subsequent, perhaps larger, enclosures from a list until an enclosure is found that can accommodate a layout of all the components on the BOM under the guidelines of the profile. For those instances where the dynamic control panel layout technology is utilized for a single custom space, the system will show where an overlap occurs or produce the layout if the given space will accommodate all the components from the BOM.

In general, the dynamic control panel layout generator compiles all the location and part data necessary to create a layout. The compiled layout data can be configured or displayed in a number of ways and formats.

Figure 12:
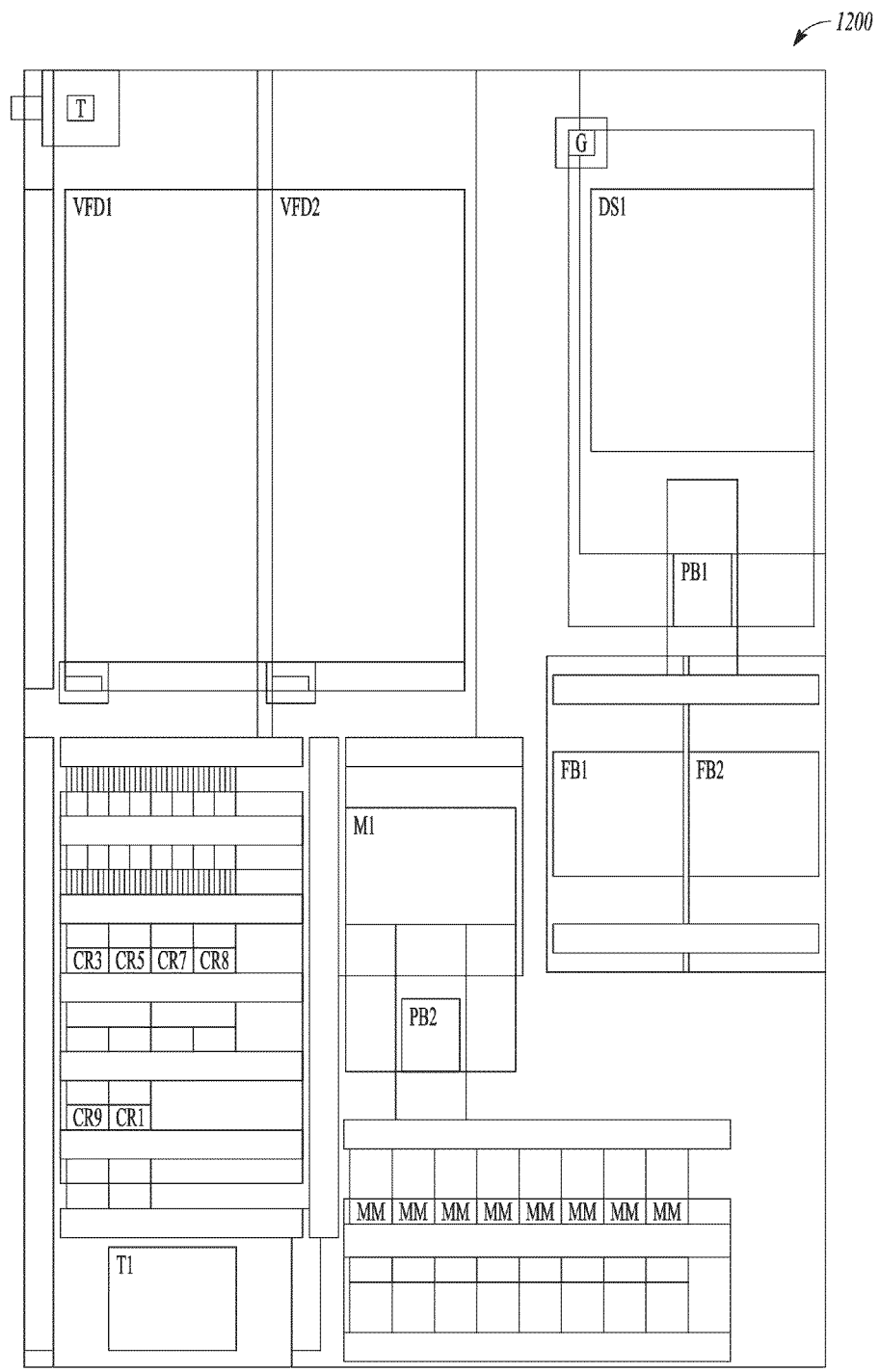
FIG. 12 is an example embodiment of a control panel layout.

The layout itself is first displayed within a Dynamic Layout Application. FIG. 12 illustrates an example layout 1200.

The compiled layout data can also be utilized to automate the generation of CAD layout drawings or solid models or eCAD. This is accomplished by post processing the compiled layout data and applying it through the application programming interfaces (API) offered by standard off the shelf CAD applications. For example the AutoCAD, SolidWorks and ePLAN brand CAD applications could be used, but many more are possible.

The compiled layout data also contains all the information necessary to modify enclosures with all the necessary mounting holes, display openings, etc. This information is compiled into instruction sets or numerical controlled (NC) milling machine input files that are used to automate the milling and drilling of these modifications.

While an embodiment of the dynamic control panel layout was developed as an extension of one or more embodiments of the APE system for application in the OEM control panel industry, it has broader applications. The dynamic control panel layout technology can be used as a stand-alone control panel design application. In such applications, the operator is typically a controls engineer doing custom control panel design. The engineer can efficiently manipulate his or her own personal general rules profile to generate control panel layouts on the fly by simply adding components to a BOM and executing the application against desired enclosures.

As described above, an embodiment of the APE layout technology was developed for specific situations when standard enclosure sizes could be pre-selected for an OEM's control panel needs. In these situations, all the mounting information for every possible component that could be placed in each of the pre-selected enclosures was captured in an up-front engineering analysis. This data was then often utilized to efficiently pre-punch sheet metal mounting plates that contained all the necessary mounting holes for all potential components. (A Swiss-cheese approach) While only a small subset of potential components are ever mounted on a single panel, and therefore only a small subset of the mounting holes are ever used, it is still often more cost effective to pre-punch these standardized mounting plates.

The dynamic control panel layout tool can be configured to take, not just a single control panel BOM as input, but the entire master parts list of components and place them, often appropriately overlapping each other, to generate the numerical controlled (NC) input necessary for the swiss-cheese mounting information files. This greatly reduces the up-front engineering analysis time necessary to determine all the mounting locations while ensuring that potential components will not interfere with each other.

In an embodiment, the Dynamic Layout Generator is used to dynamically generate electrical panel layouts. The Generator uses the following information to create the layouts—a panel's bill of materials (BOM), a list of possible enclosures, at least one Layout Profile, and data in a parts database for each component on the BOM.

FIG. 10 illustrates a high level flowchart of a process 1000 to generate a layout. Before the layout can be generated, some preprocessing must be done. For each component in the bill of materials (1005), data is retrieved from the master parts database (1010). It is assumed that a component should not be placed in the layout if no data is found in the master parts database. The Generator can be configured to produce a warning whenever a component is not found. Next, the Layout Profile (1015) and program settings (1020) (Settings Profile) are read into an "options" object 1025. The "options" object 1025 contains all of the information needed to place the components in the enclosure. It also contains a list of enclosures that may be used.

Once all of the preprocessing is complete, the actual layout generation begins. Starting with the first enclosure listed in the Settings Profile 1020, the program begins generating layouts (1030, 1035). Each group is constructed independently according to the options in the Layout Profile 1015. After all of the groups have been built and placed in the enclosure (1040, 1045, 1050), wireways are added to connect all groups that will be wired together (1055). If no valid layouts are found (1070), the process terminates. Finally, a method is called to check for overlapping components (1060). If no overlap is found, a valid layout has been generated (1065). If any component overlap is found, the program will move onto the next enclosure and generate another layout (1040). It is possible that a layout will be generated for each enclosure and still no valid layout has been found. In this case, the Layout Profile (1015) must be modified or a new Layout Profile (1015) must be created.

In an embodiment, the Generator can illustrate an invalid layout by "trying" an enclosure, that is, the Dynamic Layout Generator builds a layout in the selected enclosure. The Generator will display the result regardless of its validity (i.e., even if there is overlap). This feature allows the export of layouts that are not valid for manual tweaking.

A user of the Generator can set up a list of enclosures for a particular project and/or a particular customer. The list of enclosures includes information such as an enclosure name, a part number, a panel depth, a door height and width, and a back panel height and width.

After creating the list of enclosures, one or more Layout Profiles are added for each enclosure. In an embodiment, Layout Profiles are created using a Layout Builder tool, which is described in more detail below. When adding Layout Profiles to an enclosure, the Generator can prompt a user to select any profile variations that the user would like to use. The user can select as many profile variations as he or she would like. The user can also rearrange the profile variations by dragging and dropping them. In an embodiment, the order of the profile variations determines the order that the variations are applied to the main options. The user can also add conditions that must be met in order for a Layout Profile to be used.

A user can select among a variety of warnings/errors that he or she would like the system to display. A user can choose to display an indication that there is component overlap in a panel or layout. For example, the component overlap may be shown in red on the panel layout. A user can choose to display an indication of an overlap among groups within the panel. For example, the group overlap can be shown in red as in the component overlap case. However, group overlap is normally acceptable in a panel layout, so a user may want to disable this feature, and enable it only for debugging or other special purposes. A user can configure the Generator so as to allow overlap on the control panel door, since there is typically enough room on the door to manually move overlapping components (as contrasted with making components fit on the back panel which is usually more difficult than making the components fit on the door). A user can configure the Generator to allow component padding to extend off of the panel. It should be noted however that the component itself may be too close to the edges of a panel if the component padding extends off the panel. The Generator system can be configured so that warning messages are recorded in a log file. An extended version of the log file can be configured such that a great deal of verbose information is displayed in the log file. The Generator can further be configured to display a warning when a component is placed in the layout relative to components that do not exist in the profile. The Generator can further be configured to display a warning when a component that is listed in the BOM is not found in the Layout Profile. This feature is useful in preventing a user from accidentally leaving components out of the layout. The Generator can be configured to ignore one or more components for each Settings Profile. Any parts that a user does not want to show on the layout should be placed on this list. The Generator can be configured to display each and every layout that gets generated while finding the optimum enclosure. This feature is useful for debugging Layout Profiles, because it allows a user to see how close an enclosure was to being large enough.

The Generator can export data directly to a server to instantly create a three dimensional model of the control panel. The use of this feature normally requires an identification of a directory in which to place the files after the three dimensional model has been created, the IP address of the server, and a port of the server.

There may be times when a user only wants certain Layout Profiles to be used when certain conditions are met. This can be achieved by using a Profile Conditionals feature. The Profile Conditionals can be used in two ways. First, Layout Profiles are selected when certain criteria are met. Second, a variation is added to all Layout Profiles when certain criteria are met.

To use Profile Conditionals to select Layout Profiles, a user selects an enclosure and profile, and then selects the conditions for this Layout Profile. In an embodiment, the Generator can be configured such that all of the Profile Conditionals will show up under a drop down menu. To then add a Profile Condition to this Layout Profile, a user selects one of the Profile Conditionals from the drop down menu. A user specifies if this condition must be true or false. Finally, a user indicates that he or she would like to add the Profile Condition, and the Generator will add it.

A user can also use Profile Conditionals to add variations to the Layout Profiles. These rules can be referred to as called Conditional Variations. There are three fields that a user must identify before the user can add a Conditional Variation—the name of the variation, the Profile Conditional, and the Boolean value.

To create a Layout Profile, a user can use a tool referred to as a Layout Builder. The Layout Builder allows a user to add options and preferences for any component that could be on the Bill of Materials. To efficiently use the Layout Builder tool, a user needs to understand how the component options are setup.

There are a few key organizational divisions in a Layout Profile. The three main subdivisions are: Panel Options, Group Options, and Component Options. Before all of the fields in the options are explained, there is some key terminology that needs to be discussed.

A "group" is a set of components whose placement is dependent on the location of other panel components in the same group. In other words, any components that will be next to each other should be in the same group.

There are left, right, top, and bottom padding in the options. Padding refers to the empty space that is required on a certain side of a component, group, or back panel. This space is needed for wiring room and cooling requirements.

A wire way is a path on the back panel that is reserved for wires. The easiest way to think of a wire way is as an invisible piece of wire track. The wire ways are added automatically by the software and can be tweaked for each group.

The Layout Builder's tool includes the following options.
File
    New Layout Options: Create new Layout Profile
    Load Layout Options: Open Saved Layout Profile
    Save: Save the current Layout Profile to disc Save As . . . : Save the current Layout Profile as a new profile Close: Close the Layout Builder. If any changes were made, a user will be prompted to save the Layout Profile.

Tools

Load Wire Report: Select a wire report to read. This will populate the Wireway Information section of the Group Options Check for Profile Errors: This will run a number of checks on the current Layout Profile, looking for any potential logic errors or missing component references.

Add Variation: Adds a new variation to the profile. Variations are discussed in more detail below.

Help

View Option Documentation: View the software documentation. This is documentation for the actual code and may not be useful for the end user.

Show Help on Hover: The Layout Builder displays pop up messages when a user hovers the mouse over any field or group of fields.

The Panel Options are the smallest and simplest set of options in the Layout Profile. The most useful feature is the "Add Group" feature. The Panel Options further include a name of the Layout Profile. This field is just a reminder of which type of layout this set of options should be used for. The options further include the empty space (pad left) that is required on the left edge of the back panel. All of the pad options are useful if the perimeter of the back panel needs to be empty. The empty space (pad right) that is required on the right edge of the back panel. The empty space (pad top) that is required on the top edge of the back panel. The empty space (pad bottom) that is required on the bottom edge of the back panel.

Group Options involve three categories—General, Lines, and Wireways. These three categories contain all of the options and preferences for a single group. There may be any number of groups in a Layout Profile.

In the general category, components can be added to a group by entering a device ID. For Group Options, the name of the group should describe the set of parts that it contains. The location should describe where the group will be placed. A group can be on the back panel, the door, or any side of the enclosure. An offset can be added to a group after it is placed. Additionally, if this group is being placed relative to another group, the offset is added after this group is placed.

There are two aspects to the relative location of a group. First, there is the x-location of a group relative to the width of the back panel (or door). The alignment determines where the insertion point is located on the group. Second, there is the y-location of this group relative to the height of the back panel (or door). The alignment determines where the insertion point is located on the group.

The following are a few examples to demonstrate how relative location works.

| Case | Panel Width | Panel Height | X Loc | X Align | Y Loc | Y Align | Description of Placement |
|---|---|---|---|---|---|---|---|
| 1 | 30 | 60 | 50 | Left | 0 | Top | Top Middle |
| 2 | 30 | 60 | 100 | Right | 100 | Bottom | Bottom Right Corner |
| 3 | 30 | 60 | 50 | Center | 50 | Center | Dead Center |

Figure 13:
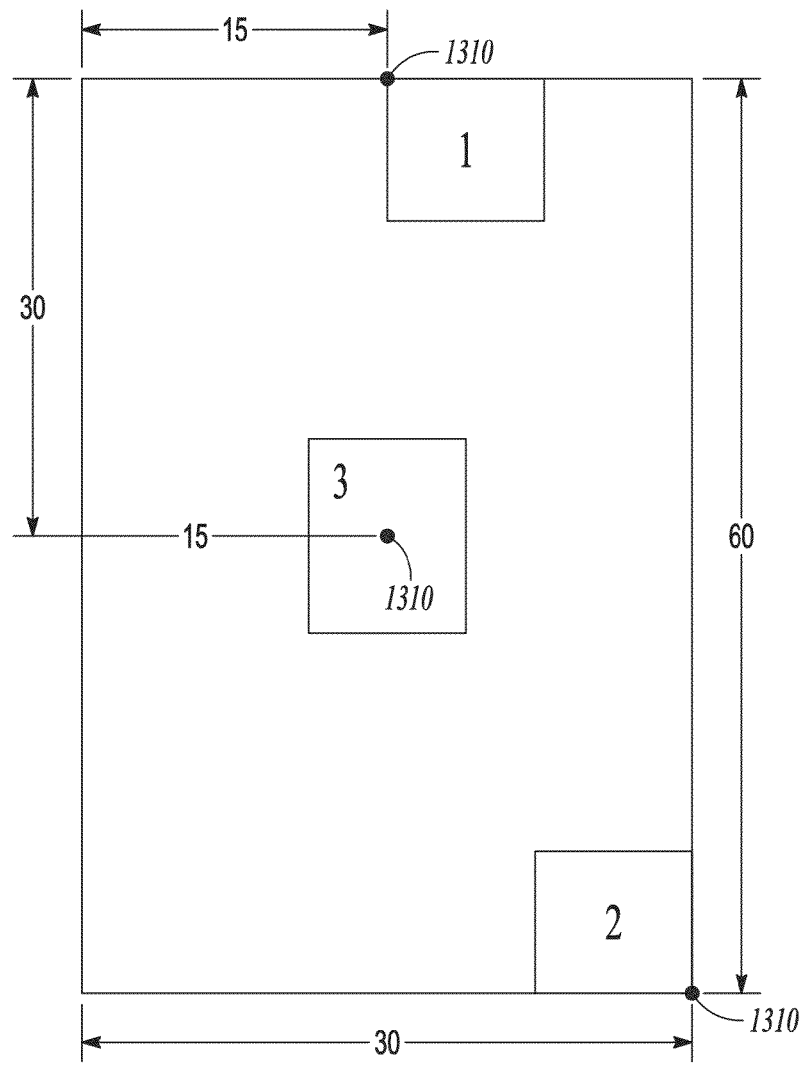
FIG. 13 is an example illustrating relative location in a control panel layout.

FIG. 13 illustrates the placement of cases 1, 2, and 3 from the chart above. The dot 1310 is the insertion point of the group. The location of this insertion point depends solely on the Alignment options. The Relative Location determines the distance between the edge of the panel and the insertion point, and the software can rearrange groups to eliminate component overlap.

When designing a Layout Profile, it is common that the location of one group depends on the location of a different group. The Relative Groups options allow groups to be placed relatively. To setup the Relative Groups options, a user indicates a relative group, selects the group just added in a list box, and fills in the Relative Groups option fields. Starting with the relative group at the top of the list, the Dynamic Layout Generator attempts to place this group relative to the relative group. If it does not succeed, it simply moves on to the next group on the list. If it goes through all of the relative groups and this group has still not been placed, the group is placed according to its relative location.

A user can indicate which side of the relative group to place a particular group. A user can specify spacing that will be added between the group in addition to the standard padding. A user can indicate the percent distance of the total height/width of the relative group at which to place a particular group. A user can indicate which dimensions of a particular group are used during group placement. This allows a user to place only the X or only the Y coordinate of a group relative to another group. A group can be centered in the control panel when relatively placing the group. A user can place a group relative to two groups.

Examples of Relative Group Options:

| Case | Side | Add. Space | Relative Location | Alignment | X | Y |
|---|---|---|---|---|---|---|
| 1 | Top | 0 | 0 | Left | Yes | Yes |
| 2 | Bottom | 0 | 50 | Center | Yes | Yes |
| 3 | Right | 0 | 50 | Bottom | Yes | Yes |
| 4 | Left | 4 | 0 | Top | Yes | Yes |
| 5 | Top | 0 | 0 | Left | Yes | No |

Figure 14:
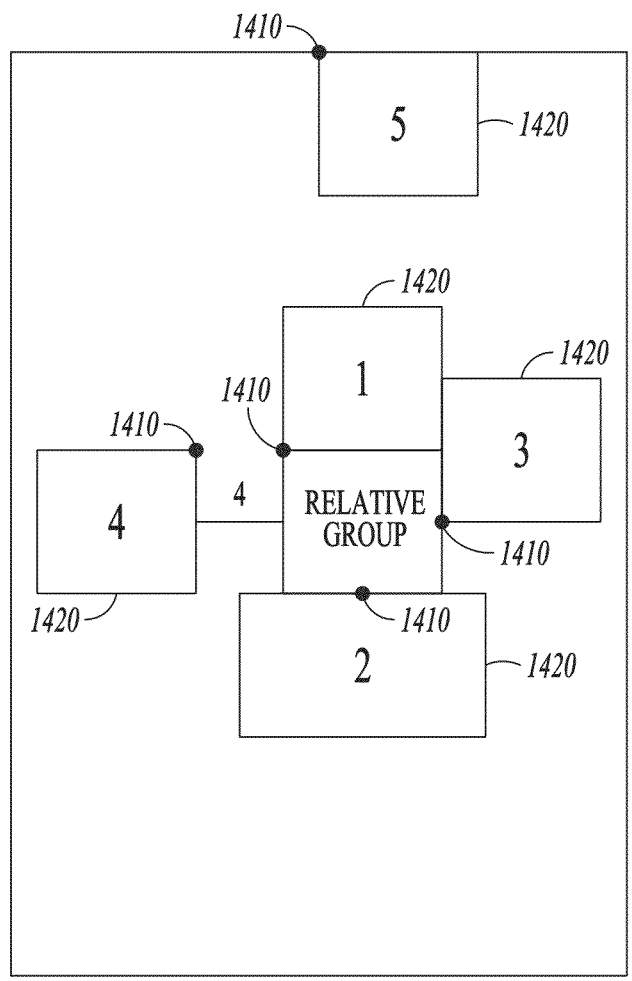
FIG. 14 is an example illustrating the relationship between relative location and alignment.

An easy way to see the relationship between Relative Location and Alignment is by looking at the dots 1410 in FIG. 14. The location of the dots 1410 on the rectangles 1420 is determined entirely by the Alignment field. Next, the rectangles 1420 and the dots 1410 are shifted <Relative Location>% down the relative group.

An embodiment includes line options that allow a user to automatically build lines of components within the control panels. This can save time when a user has a large number of possible device IDs and the user does not want to take the time to enter in options for all of them.

The features associated with a line option include setting minimum and maximum length of the lines, adding up to three lines, placing components in a line on Dinrail, adding extra din rail to each line, placing a line horizontally or vertically, placing a piece of wire track between each line, and selecting which components go on which line and in which order. In an embodiment, a user interface includes a "Types in Group" box. This box is automatically populated for the user with all of the different component types that are in this group. To specify which components are on which line, a user simply drags the desired "Type" into one of the "Line Boxes." The "Types" can be rearranged by dragging and dropping once they are in the "Line Boxes".

There are a number of other fields related to Line Options as well. A user can set a minimum and maximum length of the lines, and a user can set a minimum and maximum number of lines. While a user can set the length and number of lines, the user can also configure the system to ignore the length of lines and number of lines parameters. When these parameters are ignored, the Generator will create a line that is as long as possible before overlapping another group or going off the back panel. The Line Options can be used on a user interface page by page basis. The Generator can be configured to add a wire track between each line. With this option, padding requirements are maintained for all components on the lines. As noted, a user can configure a layout such that a line will run either horizontally across a back panel or door, or run vertically across a back panel or door. The Generator can further be configured such that all components on a line reside on din rail, and further wherein the user can specify a number of extra inches of din rail that will be added to the end of each line. The user can configure the system such that all lines will have the same length of din rail. This is useful if a user wants to ensure that this group will be a rectangle.

A wire ways option allows a user to choose which sides of each group should contain wire ways—no wireway, wireway, and wireway with wiretrack. A user can set the "Nominal Space" between the group and the wire way.

The wire way option user interface can include an information section that shows which groups that a group is connected to and also gives information about the wires that are connected to any component in this group. This information can be reported in a wire report. A wire report can be used dynamically to determine the padding of each component based on wire bending radii.

A Part Options user interface page has all of the options for placing a single component in a group. When a group is being built, each component's "placement priority" is based on its position in a tree view on the left hand side of this window. Both Group and Parts can be rearranged by dragging and dropping into the order they should be placed on the back panel/door.

There is a plurality of parts options. The Name is the device ID of a component. In a user interface, a user may use a wild card format to include multiple device IDs. The Type is the type of a component. This must match the type given in the master parts database. This field allows multiple components to be placed in an enclosure that have the same device ID. (e.g., VFD and VFD Keypad, both with device ID "VFD1"). A user can further specify an angle that a component can or should be rotated when it is placed within the layout or enclosure. A user can specify that a component may be placed in a line using the Line Options in this component's Group Options. A user can place a component on another component's padding. This feature is useful for small parts that have a low profile. (e.g., ground lugs and grounding strings). A user can also configure the Generator such that component overlap is ignored. Some components can be mounted directly on sheet metal or on din rail. The Generator can be configured such that any component that can be mounted on din rail will be so mounted, and configured such that if a user would like to make sure that a component is not mounted on din rail, it will not be so mounted.

A user can specify an absolute X and Y coordinate of a component within a group. It should be noted that this is not an absolute X/Y coordinate for the entire back panel/door. A user can specify the padding on any side of a component. A default padding is stored in the master parts database. However, a user can override the default padding values.

A user can align door components over the back panel. Specifically, sometimes a component on the door must be aligned over a component on the back panel. For example, this is the case for a disconnect and its handle. To achieve this, a data table will store a point (x/y) on any component that may need to use this option. If any two components need to be aligned, the component on the back panel will be placed in a normal fashion. When selecting the options for the door mounted component, a user also provides the device ID of the back panel mounted component. If the user has selected the "Align Over Component" option, the software retrieves the points that must be aligned and places the door mounted component accordingly.

Wild card device IDs are a powerful feature when adding a component that can have many different device IDs. Certain components, such as MMPs, often have many different possible device IDs. (e.g., MMP1 through MMP40) Instead of adding 40 parts to a group, a user can cover all 40 MMPs with a single wild card.

Problems can quickly arise when attempting to place components with wild card device IDs relative to one another. To solve this problem, another wild card with a slightly different syntax may be used to reference relative parts.

After a user has created a Settings Profile and a Layout Profile, the user can start generating layouts. First, a user should verify that at least one Layout Profile is linked to each enclosure in the Settings Profile. If not, no layout will be generated.

A user selects a bill of materials, and a layout is generated based on Settings Profile, the Layout Profile, and the Bill of Materials.

A user may get a "Profile is Missing Device IDs" warning if the bill of materials contains any device IDs that are not in the Layout Profile. At this point, a user has the option to either stop running the Dynamic Layout Generator, save the list of missing device IDs to file, or continue running the Dynamic Layout Generator and ignore this warning. It is recommended that a user add the missing device IDs to the Layout Profile, or if the user does not need them, add them to the user's ignore list. If this error does not appear, that means a layout should have been created. A user can check the Log to make sure that a valid layout was successfully found. If the layout generation was successful, a diagram of the layout is displayed to the user.

A user may want to see how the layout would look in a certain enclosure. An embodiment includes a "Try Enclosure" feature that allows a user to do this. The drop down box in the "Try Enclosure" section is automatically populated with all of the enclosures that a user has entered in the Settings Profile. First, a user selects a bill of materials to try, initiates the Try Enclosure, and the layout is displayed irrespective of whether it is valid or not. If the user selected an enclosure that is too small, the user will see overlapping components. A user can try enclosures that almost fit and this is a good way to see how the Layout Profile needs to be tweaked. As noted previously, FIG. 12 illustrates an example of a display of a layout.

A user can move and zoom in/out of the layout using a computer mouse. To move the image, a user holds the middle mouse button (or scroll wheel) and moves the mouse. To zoom in/out of the image, the user uses the scroll wheel. Scrolling up zooms in and scrolling down zooms out.

A toolbox allows a user to toggle different layers on and off in the layout image. The layer settings are automatically saved in the Settings Profile. These layers include physical parts, part padding, physical groups, group padding, part labels, dinrail, overlap, and wireways.

After a user has generated a layout and the user is satisfied with how it looks, the user can export the layout to a number of formats. For example, the user can export the generated layout to a DXF file. Additionally, "ShortestDistance" exports and "SolidWorks" exports will usually be done using the Dynamic Layout DLL.

Figure 15A:
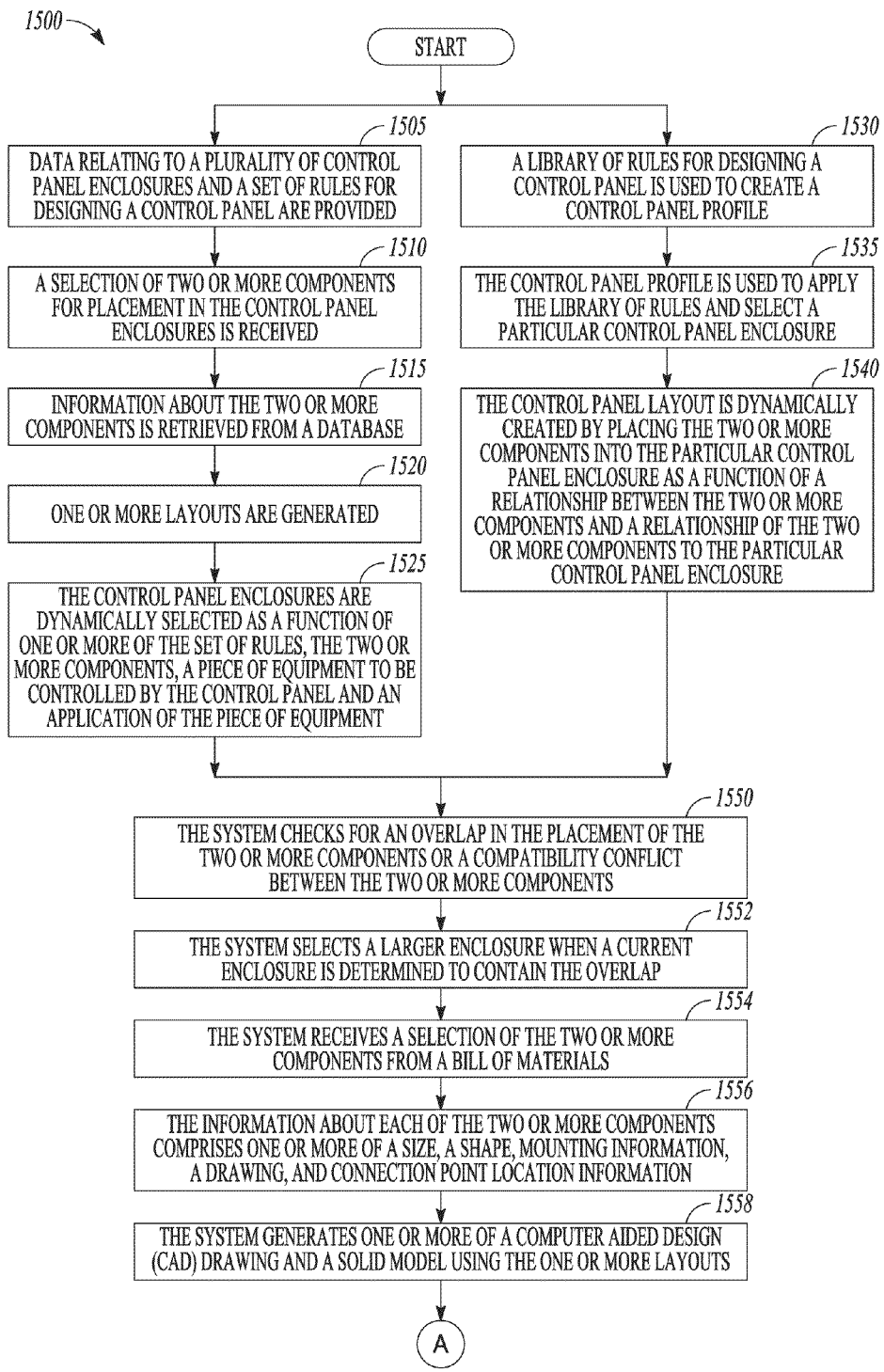
FIGS. 15A and 15B are an example embodiment of a process to dynamically create a control panel layout.
Figure 15B:
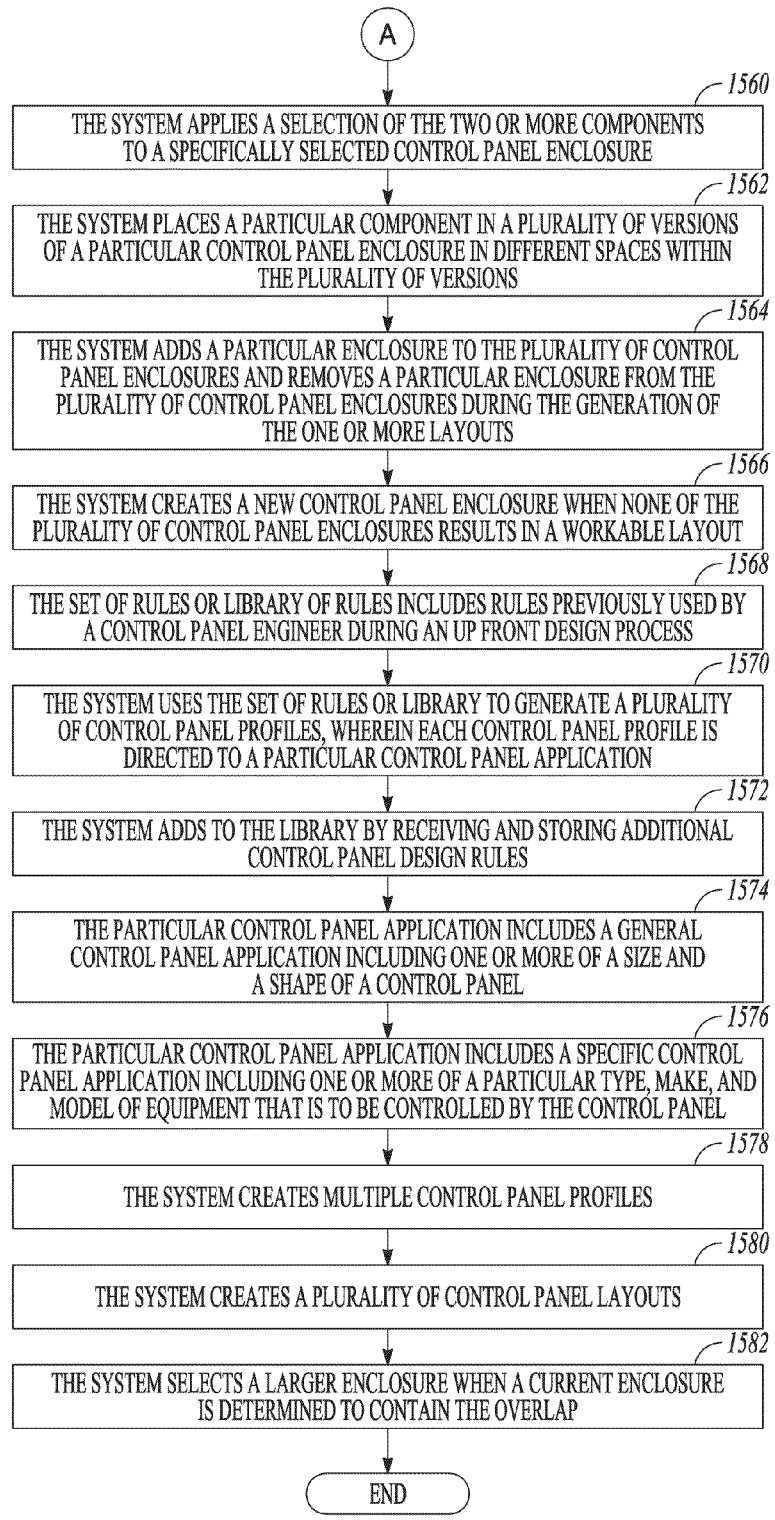

FIG. 15 is a block diagram 1500 illustrating the features of a dynamic generator. FIG. 15 includes a number of blocks 1505-1582. Though arranged serially in the example of FIG. 15, other examples may reorder the blocks, omit one or more blocks, and/or execute two or more blocks in parallel using multiple processors or a single processor organized as two or more virtual machines or sub-processors. Moreover, still other examples can implement the blocks as one or more specific interconnected hardware or integrated circuit modules with related control and data signals communicated between and through the modules. Thus, any process flow is applicable to software, firmware, hardware, and hybrid implementations.

Referring to FIG. 15, at 1505, data relating to a plurality of control panel enclosures and a set of rules for designing a control panel are provided. At 1510, a selection of two or more components for placement in the control panel enclosures is received. At 1515, information about the two or more components is retrieved from a database. At 1520, one or more layouts are generated. The one or more layouts include placement of the two or more components within at least one of the plurality of control panel enclosures as a function of the set of rules for designing a control panel. At 1525, the control panel enclosures are dynamically selected as a function of one or more of the set of rules, the two or more components, a piece of equipment to be controlled by the control panel and an application of the piece of equipment.

In an alternative embodiment, as indicated starting at 1530, a library of rules for designing a control panel is used to create a control panel profile. The control panel profile includes design criteria for a particular control panel application. At 1535, the control panel profile is used to apply the library of rules and select a particular control panel enclosure. At 1540, the control panel layout is dynamically created by placing the two or more components into the particular control panel enclosure as a function of a relationship between the two or more components and a relationship of the two or more components to the particular control panel enclosure.

At 1550, the system checks for an overlap in the placement of the two or more components or a compatibility conflict between the two or more components. At 1552, the system selects a larger enclosure when a current enclosure is determined to contain the overlap. At 1554, the system receives a selection of the two or more components from a bill of materials. At 1556, the information about each of the two or more components comprises one or more of a size, a shape, mounting information, a drawing, and connection point location information. At 1558, the system generates one or more of a computer aided design (CAD) drawing and a solid model using the one or more layouts.

At 1560, the system applies a selection of the two or more components to a specifically selected control panel enclosure. At 1562, the system places a particular component in a plurality of versions of a particular control panel enclosure in different spaces within the plurality of versions. At 1564, the system adds a particular enclosure to the plurality of control panel enclosures and removes a particular enclosure from the plurality of control panel enclosures during the generation of the one or more layouts. At 1566, the system creates a new control panel enclosure when none of the plurality of control panel enclosures results in a workable layout. At 1568, the set of rules or library of rules includes rules previously used by a control panel engineer during an upfront design process.

At 1570, the system uses the set of rules or library to generate a plurality of control panel profiles, wherein each control panel profile is directed to a particular control panel application. At 1572, the system adds to the library by receiving and storing additional control panel design rules. At 1574, the particular control panel application includes a general control panel application including one or more of a size and a shape of a control panel. At 1576, the particular control panel application includes a specific control panel application including one or more of a particular type, make, and model of equipment that is to be controlled by the control panel. At 1578, the system creates multiple control panel profiles. At 1580, the system creates a plurality of control panel layouts. At 1582, the system selects a larger enclosure when a current enclosure is determined to contain the overlap.

Dynamic Generator Example

The following paragraphs and FIGS. 16A-16B, 17A and 17B, 18, and 19 illustrate an example implementation of the Dynamic Generator.

Figure 18:
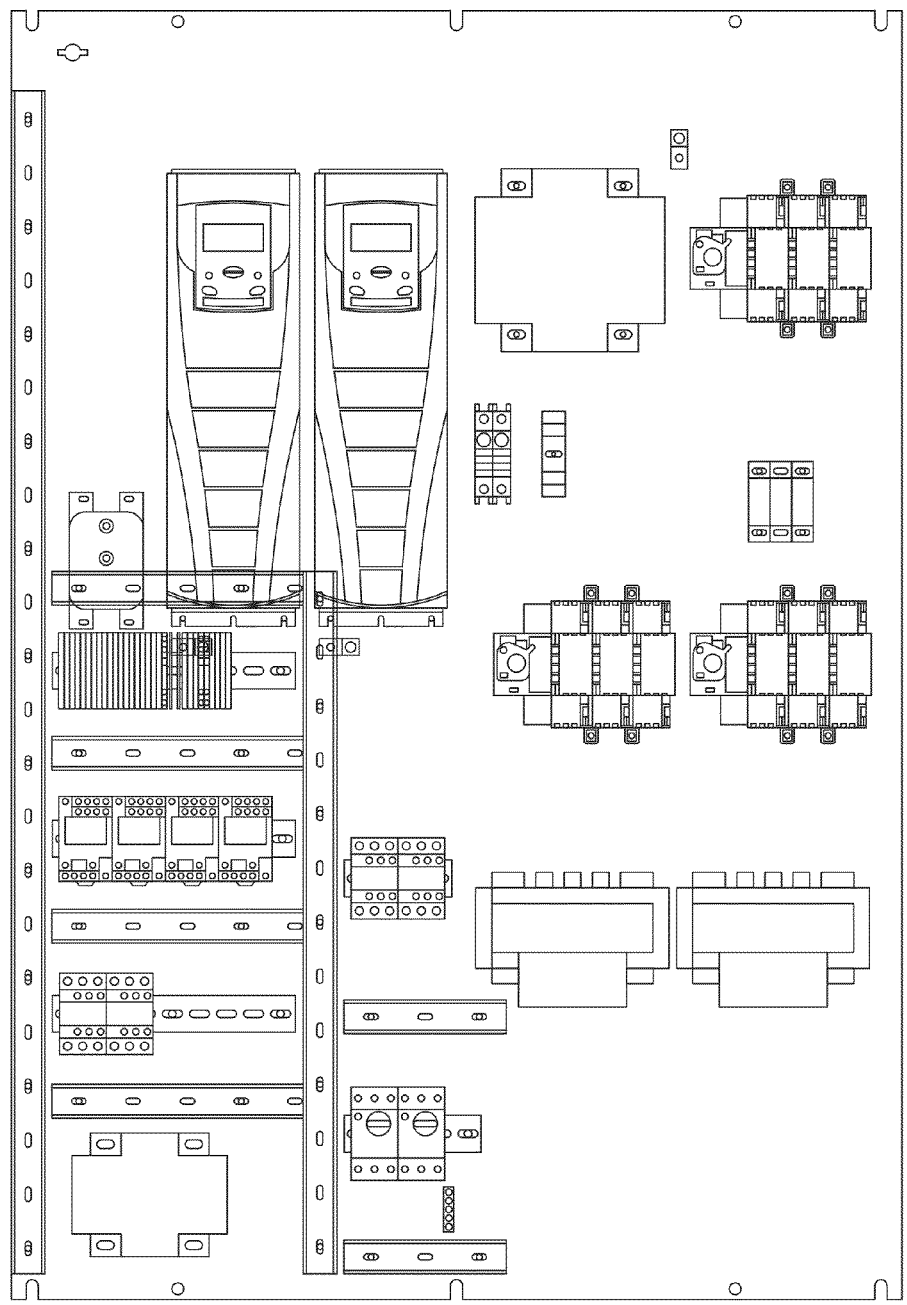
FIG. 18 is an example of a control panel layout with an overlap of components.
Figure 19:
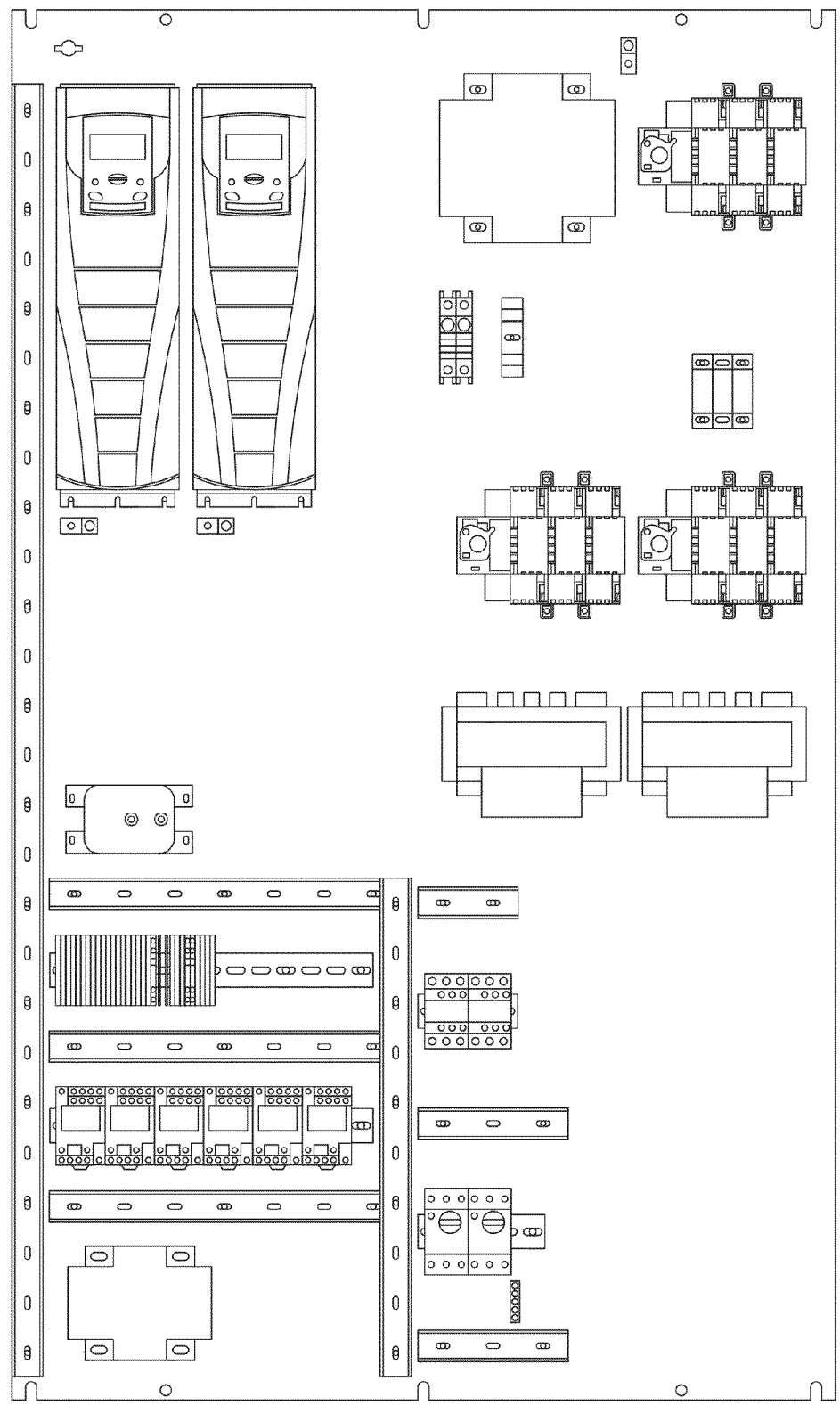
FIG. 19 is an example of a control panel layout without an overlap of components.

FIGS. 16A-16B are an example of a bill of materials (BOM). FIG. 17 is a portion of a profile (VFD (Variable Frequency Drive) profile example). FIGS. 18 and 19 illustrate two example layouts that show the results when the profile is used by the dynamic layout generator to place the components from the BOM into two different sized enclosures.

The example profile rules shown in FIG. 17 describe the placement of VFD components. First, all of the VFDs are grouped together with some other minor components. Then, the first VFD found in the BOM is placed in the upper left hand corner of the enclosure. If the dynamic generator finds additional VFDs in the BOM, it places them to the right of the first VFD. In this BOM example, there are two VFDs that the profile finds and processes.

The profile can be used to place the components in the BOM into various sized enclosures. In the first example layout diagram (FIG. 18—Overlap Layout), the enclosure is too small and an overlap occurs. The Dynamic Generator can the try a larger enclosure until everything fits as shown in the second example layout (FIG. 19—Valid Layout).

Figure 20:
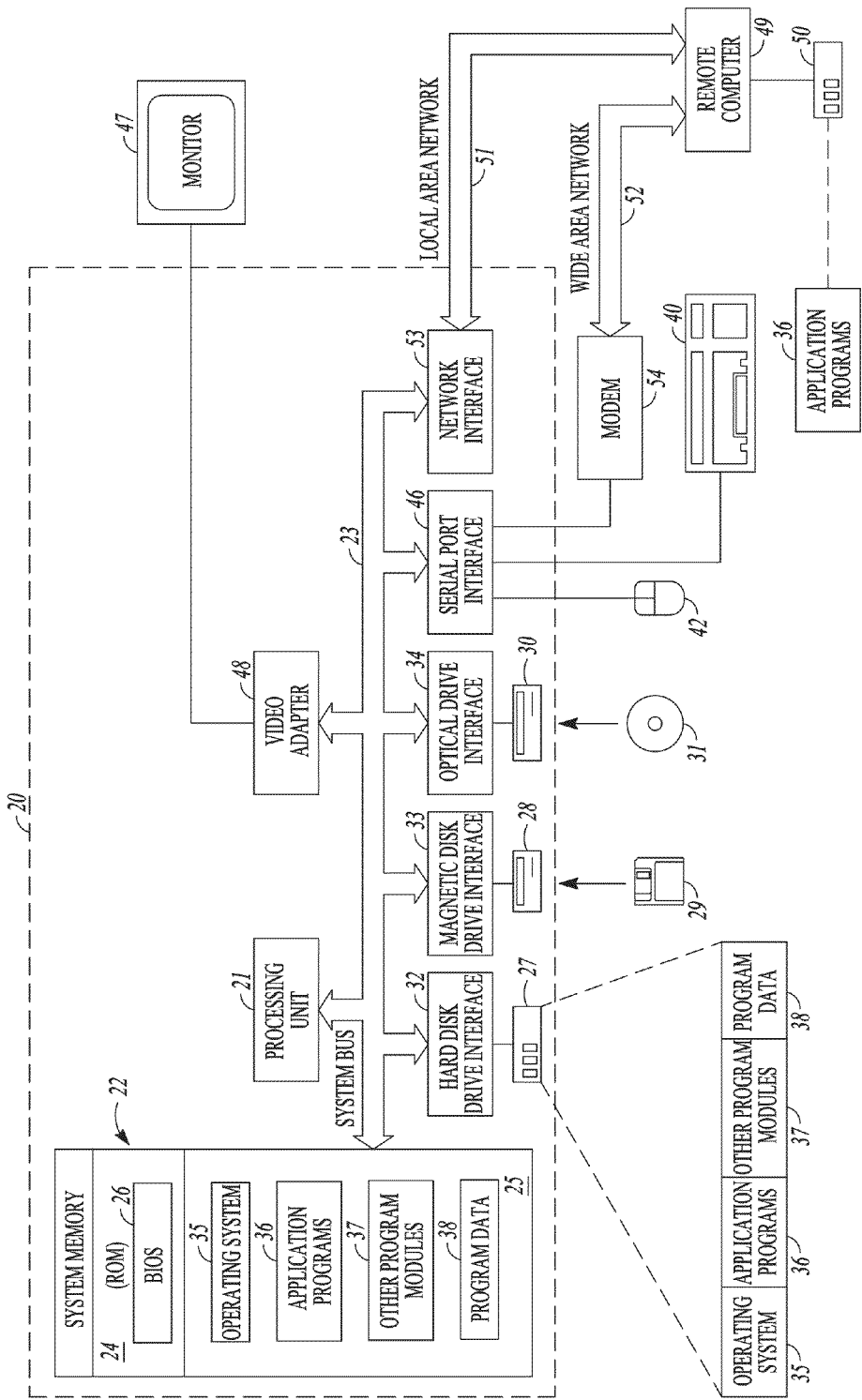
FIG. 20 is a block diagram of an example embodiment of a computer system upon which an embodiment can execute.

FIG. 20 is an overview diagram of a hardware and operating environment in conjunction with which embodiments of the invention may be practiced. The description of FIG. 20 is intended to provide a brief, general description of suitable computer hardware and a suitable computing environment in conjunction with which the invention may be implemented. In some embodiments, the invention is described in the general context of computer-executable instructions, such as program modules, being executed by a computer, such as a personal computer. Generally, program modules include routines, programs, objects, components, data structures, etc., that perform particular tasks or implement particular abstract data types.

Moreover, those skilled in the art will appreciate that the invention may be practiced with other computer system configurations, including hand-held devices, multiprocessor systems, microprocessor-based or programmable consumer electronics, network PCS, minicomputers, mainframe computers, and the like. The invention may also be practiced in distributed computer environments where tasks are performed by I/O remote processing devices that are linked through a communications network. In a distributed computing environment, program modules may be located in both local and remote memory storage devices.

In the embodiment shown in FIG. 20, a hardware and operating environment is provided that is applicable to any of the servers and/or remote clients shown in the other Figures.

As shown in FIG. 20, one embodiment of the hardware and operating environment includes a general purpose computing device in the form of a computer 20 (e.g., a personal computer, workstation, or server), including one or more processing units 21, a system memory 22, and a system bus 23 that operatively couples various system components including the system memory 22 to the processing unit 21. There may be only one or there may be more than one processing unit 21, such that the processor of computer 20 comprises a single central-processing unit (CPU), or a plurality of processing units, commonly referred to as a multiprocessor or parallel-processor environment. A multiprocessor system can include cloud computing environments. In various embodiments, computer 20 is a conventional computer, a distributed computer, or any other type of computer.

The system bus 23 can be any of several types of bus structures including a memory bus or memory controller, a peripheral bus, and a local bus using any of a variety of bus architectures. The system memory can also be referred to as simply the memory, and, in some embodiments, includes read-only memory (ROM) 24 and random-access memory (RAM) 25. A basic input/output system (BIOS) program 26, containing the basic routines that help to transfer information between elements within the computer 20, such as during start-up, may be stored in ROM 24. The computer 20 further includes a hard disk drive 27 for reading from and writing to a hard disk, not shown, a magnetic disk drive 28 for reading from or writing to a removable magnetic disk 29, and an optical disk drive 30 for reading from or writing to a removable optical disk 31 such as a CD ROM or other optical media.

The hard disk drive 27, magnetic disk drive 28, and optical disk drive 30 couple with a hard disk drive interface 32, a magnetic disk drive interface 33, and an optical disk drive interface 34, respectively. The drives and their associated computer-readable media provide non volatile storage of computer-readable instructions, data structures, program modules and other data for the computer 20. It should be appreciated by those skilled in the art that any type of computer-readable media which can store data that is accessible by a computer, such as magnetic cassettes, flash memory cards, digital video disks, Bernoulli cartridges, random access memories (RAMs), read only memories (ROMs), redundant arrays of independent disks (e.g., RAID storage devices) and the like, can be used in the exemplary operating environment.

A plurality of program modules can be stored on the hard disk, magnetic disk 29, optical disk 31, ROM 24, or RAM 25, including an operating system 35, one or more application programs 36, other program modules 37, and program data 38. A plug in containing a security transmission engine for the present invention can be resident on any one or number of these computer-readable media.

A user may enter commands and information into computer 20 through input devices such as a keyboard 40 and pointing device 42. Other input devices (not shown) can include a microphone, joystick, game pad, satellite dish, scanner, or the like. These other input devices are often connected to the processing unit 21 through a serial port interface 46 that is coupled to the system bus 23, but can be connected by other interfaces, such as a parallel port, game port, or a universal serial bus (USB). A monitor 47 or other type of display device can also be connected to the system bus 23 via an interface, such as a video adapter 48. The monitor 40 can display a graphical user interface for the user. In addition to the monitor 40, computers typically include other peripheral output devices (not shown), such as speakers and printers.

The computer 20 may operate in a networked environment using logical connections to one or more remote computers or servers, such as remote computer 49. These logical connections are achieved by a communication device coupled to or a part of the computer 20; the invention is not limited to a particular type of communications device. The remote computer 49 can be another computer, a server, a router, a network PC, a client, a peer device or other common network node, and typically includes many or all of the elements described above I/O relative to the computer 20, although only a memory storage device 50 has been illustrated. The logical connections depicted in FIG. 20 include a local area network (LAN) 51 and/or a wide area network (WAN) 52. Such networking environments are commonplace in office networks, enterprise-wide computer networks, intranets and the internet, which are all types of networks.

When used in a LAN-networking environment, the computer 20 is connected to the LAN 51 through a network interface or adapter 53, which is one type of communications device. In some embodiments, when used in a WAN-networking environment, the computer 20 typically includes a modem 54 (another type of communications device) or any other type of communications device, e.g., a wireless transceiver, for establishing communications over the wide-area network 52, such as the internet. The modem 54, which may be internal or external, is connected to the system bus 23 via the serial port interface 46. In a networked environment, program modules depicted relative to the computer 20 can be stored in the remote memory storage device 50 of remote computer, or server 49. It is appreciated that the network connections shown are exemplary and other means of, and communications devices for, establishing a communications link between the computers may be used including hybrid fiber-coax connections, T1-T3 lines, DSL's, OC-3 and/or OC-12, TCP/IP, microwave, wireless application protocol, and any other electronic media through any suitable switches, routers, outlets and power lines, as the same are known and understood by one of ordinary skill in the art.

Thus, an example system, method and machine readable medium for dynamically generating control panel layouts have been described. Although specific example embodiments have been described, it will be evident that various modifications and changes may be made to these embodiments without departing from the broader spirit and scope of the invention. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract is provided to comply with 37 C.F.R. §1.72(b) and will allow the reader to quickly ascertain the nature and gist of the technical disclosure. It is submitted with the understanding that it will not be used to interpret or limit the scope or meaning of the claims.

In the foregoing description of the embodiments, various features are grouped together in a single embodiment for the purpose of streamlining the disclosure. This method of disclosure is not to be interpreted as reflecting that the claimed embodiments have more features than are expressly recited in each claim. Rather, as the following claims reflect, inventive subject matter lies in less than all features of a single disclosed embodiment. Thus the following claims are hereby incorporated into the Description of the Embodiments, with each claim standing on its own as a separate example embodiment.

CONCLUSION

The embodiments described above and in the claims are intended only to illustrate and teach one or more ways of practicing or implementing the present invention, not to restrict its breadth or scope. The actual scope of the invention, which embraces all ways of practicing or implementing the teachings of the invention, is defined only by the issued claims and their equivalents.

What is claimed is:

1. A system comprising:
   a computer storage medium comprising a database of data relating to a plurality of control panel enclosures, a plurality of components, and a set of rules for designing a control panel; and
   one or more computer processors configured to:
   receive a selection of two or more components for placement in an enclosure;
   retrieve information about the two or more components from the database;
   generate one or more layouts, the one or more layouts comprising placement of the two or more components within at least one of a plurality of control panel enclosures as a function of the data relating to the set of rules; and
   dynamically selecting a control panel enclosure from the plurality of control panel enclosures as a function of one or more of the data relating to the set of rules, the two or more components, a piece of equipment to be controlled and an application of the piece of equipment.

2. The system of claim 1, comprising the one or more computer processors further configured to check for an overlap in the placement of the two or more components or a compatibility conflict between the two or more components.

3. The system of claim 2, comprising the one or more computer processors further configured to select a larger control panel enclosure when a current generated layout is determined to contain the overlap.

4. The system of claim 1, wherein the one or more computer processors is further configured to receive the selection of two or more components from a bill of materials.

5. The system of claim 1, wherein the information about the two or more components comprises one or more of a size, a shape, mounting information, a drawing, and connection point location information.

6. The system of claim 1, comprising the one or more computer processors further configured to generate one or more of a computer aided design (CAD) drawing and a solid model using the generated one or more layouts.

7. The system of claim 1, comprising the one or more computer processors further configured to apply the selection of two or more components to a specifically selected control panel enclosure.

8. The system of claim 1, wherein placement of the two or more components further comprises placing a particular component in a plurality of versions of a particular control panel enclosure in different spaces within the plurality of versions.

9. The system of cairn 1, comprising the one or more computer processors further configured to add data to the database relating to a particular enclosure and to remove data associated with a particular enclosure from the database of data during the generation of the one or more layouts.

10. The system of claim 1, comprising the one or more computer processors further configured to create data relating to a new control panel enclosure when use of data related to the plurality of control panel enclosures does not result in a workable layout.

11. The system of claim 1, wherein the set of rules comprises rules previously used by a control panel engineer during an upfront design process.

12. The system of claim 1, wherein the set of rules comprises a library of control panel design rules.

13. The system of claim 12, comprising the one or more computer processors further configured to use the library to generate a plurality of control panel profiles, wherein each control panel profile is directed to a particular control panel application.

14. The system of claim 12, comprising the one or more computer processors further configured to add to the library by receiving and storing additional data related to control panel design rules.

15. A system comprising:
   a computer storage medium comprising data relating to a plurality of control panel enclosures and a library of rules for designing a control panel; and
   a computer processor configured to:
   use the data relating to the library of rules to create a control panel profile, the control panel profile including design criteria for a particular control panel application;
   receive an identification of two or more components for placement into an enclosure layout;
   use the control panel profile to select a particular control panel enclosure; and
   dynamically create a control panel layout as a function of a relationship between the two or more components and a relationship of the two or more components to the particular control panel enclosure.

16. The system of claim 15, comprising the computer processor further configured to add to data relating to the library of rules by receiving and storing additional data relating to rules for designing a control panel.

17. The system of claim 15, wherein the identification of two or more components is included within a bill of materials.

18. The system of claim 15, wherein the particular control panel application comprises a general control panel application including one or more of a size and a shape of a control panel.

19. The system of claim 15, wherein the design criteria for a particular control panel application comprises one or more of a particular type, make, and model of equipment that is to be controlled by a control panel.

20. The system of claim 15, wherein the computer processor is configured to create multiple control panel profiles.

21. The system of claim 15, wherein the computer processor is configured to create a plurality of control panel layouts.

22. The system of claim 15, comprising the computer processor configured to check for an overlap in a placement of the two or more components or a compatibility conflict between the two or more components.

23. The system of claim 22, comprising computer processor further configured to select a larger control panel enclosure when a current articular control and enclosure is determined to contain overlap.

24. The system of claim 15, further including information data related to the two or more components, said information data comprises one or more of a size, a shape, mounting information, a drawing, and connection point location information.

25. The system of claim 15, comprising the computer processor further configured to generate one or more of a computer aided design (CAD) drawing and a solid model using the control panel layout.

26. The system of claim 15, comprising the computer processor further configured to apply a selection of the two or more components to a specifically selected control panel enclosure.

27. The system of claim 15, wherein to dynamically create a control panel the computer processor is further configured to place a particular component in a plurality of versions of a particular control panel enclosure in different spaces within the plurality of versions.

28. The system of claim 15, comprising the computer processor further configured to add data relating to a particular enclosure to the data relating to the plurality of control panel enclosures and to remove data relating to a particular enclosure from the data relating to the plurality of control panel enclosures during the creation of the control panel layout.

29. The system of claim 15, comprising the computer processor further configured to create data relating to a new control panel enclosure when the data relating to the plurality of control panel enclosures does not result in a workable layout.

30. The system of claim 15, wherein the data relating to the library of rules comprises data previously used by a control panel engineer during an upfront design process.

31. The system of claim 30, comprising the computer processor further configured to use the data relating to the library of rules to generate a plurality of control panel profiles, wherein each control panel profile is directed to a particular control panel application.

32. A system comprising:
a computer storage medium at least comprising data relating to control panel enclosures, control panel layouts, control panel components, and control panel design rules; and
a computer processor configured to:
select data relating to a first control panel layout from the data relating to control panel layouts;
sequentially select data relating to control panel components;
dynamically compare data relating to control panel design rules with data relating to control panel components and the first control panel layout to determine congruence between the first control panel layout and data relating to control panel enclosures, control panel components, and control panel design rules;
accept or reject selected data relating to the control panel components and the first control panel layout;
associate control panel components with the first control panel layout; and
compile control panel layout data.

33. The system as recited in claim 32, said control panel design rules including rules related to component design, layout design and enclosure design.

34. The system as recited in claim 32, said computer processor further configured to sequentially select data relating to control panel components from data related to a bill of material.

35. The system as recited in claim 32, said computer processor further configured to select data relating to a second control panel layout from the data relating to control panel layouts when selected data relating to the control panel components and the first control panel layout is rejected.

36. The system as recited in claim 32, said computer processor further configured to add to the computer storage medium data related to the comparison of data relating to control panel design rules with data relating to control panel components and the first control panel layout.

37. The system of claim 32, said computer processor further configured to create a subset of data related to control panel design rules.

38. The system as recited in claim 37, said computer processor further configured to add to the computer storage medium the subset of data related to control panel design rules.

39. The system as recited in claim 32, wherein determining congruence between the first control panel layout and data relating to control panel enclosures, control panel components, and control panel design rules further includes determining compatibility between two or more control panel components.

40. The system according to claim 32, wherein data related to control panel components includes data related to a size, a shape, mounting information, a drawing, and connection point location information.

41. A process comprising:
storing in a computer storage medium data relating to control panel enclosures, control panel layouts, control panel components, and control panel design rules;
sequentially selecting data relating to control panel components;
selecting data relating to a first control panel layout from the data relating to control panel layouts;
dynamically comparing data relating to control panel design rules with data relating to control panel components and the first control panel layout;
determining congruence between the first control panel layout and data relating to control panel enclosures, control panel components, and control panel design rules;
accepting or rejecting selected data relating to the control panel components and the first control panel layout;
associating control panel components with the first control panel layout; and
compiling control panel layout data.

* * * * *

UNITED STATES PATENT AND TRADEMARK OFFICE
CERTIFICATE OF CORRECTION

| | | |
|---|---|---|
| PATENT NO. | : 9,026,409 B2 | Page 1 of 1 |
| APPLICATION NO. | : 13/207009 | |
| DATED | : May 5, 2015 | |
| INVENTOR(S) | : Schmidtke et al. | |

It is certified that error appears in the above-identified patent and that said Letters Patent is hereby corrected as shown below:

In the Claims

Claim 9, at column 28 line 24, "cairn" should read "claim"

Signed and Sealed this
Twenty-second Day of September, 2015

Michelle K. Lee
*Director of the United States Patent and Trademark Office*